(12) United States Patent  (10) Patent No.: US 7,115,476 B1
Izumida  (45) Date of Patent: Oct. 3, 2006

(54) SEMICONDUCTOR MANUFACTURING METHOD AND SEMICONDUCTOR DEVICE

(75) Inventor: Takashi Izumida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/201,264

(22) Filed: Aug. 11, 2005

(30) Foreign Application Priority Data

Apr. 28, 2005  (JP)  ............................. 2005-133330

(51) Int. Cl.
*H01L 21/336* (2006.01)
(52) U.S. Cl. ............... 438/268; 438/563; 257/E29.262; 257/E21.629; 257/E21.468
(58) Field of Classification Search ............... 438/212, 438/268, 270, 563, FOR. 192; 257/302, 257/E29.262, E21.375, E21.41, E21.629, 257/E21.643, E21.468
See application file for complete search history.

(56) References Cited

U.S. PATENT DOCUMENTS

| | | | | |
|---|---|---|---|---|
| 5,218,218 | A * | 6/1993 | Akazawa | 257/302 |
| 5,302,541 | A * | 4/1994 | Akazawa | 438/152 |
| 6,376,312 | B1 * | 4/2002 | Yu | 438/268 |
| 6,387,758 | B1 * | 5/2002 | Yu et al. | 438/269 |
| 6,437,401 | B1 * | 8/2002 | Mandelman et al. | 257/330 |
| 6,690,040 | B1 * | 2/2004 | Chaudhry et al. | 257/135 |
| 6,727,544 | B1 | 4/2004 | Endoh et al. | |
| 6,759,730 | B1 * | 7/2004 | Chaudhry et al. | 257/586 |
| 6,773,994 | B1 * | 8/2004 | Chittipeddi et al. | 438/268 |
| 6,800,898 | B1 * | 10/2004 | Cappelani et al. | 257/329 |
| 7,009,237 | B1 * | 3/2006 | Adkisson et al. | 257/301 |
| 7,033,877 | B1 * | 4/2006 | Chaudhry et al. | 438/212 |
| 2003/0052365 | A1 * | 3/2003 | Chaudhry et al. | 257/328 |
| 2004/0070007 | A1 * | 4/2004 | Zhang | 257/200 |
| 2004/0110345 | A1 * | 6/2004 | Chaudhry et al. | 438/270 |
| 2004/0155264 | A1 * | 8/2004 | Chaudhry et al. | 257/200 |
| 2004/0188737 | A1 * | 9/2004 | Chaudhry et al. | 257/296 |
| 2005/0048709 | A1 * | 3/2005 | Layman et al. | 438/199 |
| 2005/0164516 | A1 * | 7/2005 | Chaudhry et al. | 438/763 |

FOREIGN PATENT DOCUMENTS

| | | |
|---|---|---|
| JP | 2003-086714 A | 3/2003 |
| JP | 2003-092366 A | 3/2003 |
| JP | 2004-186601 A | 7/2004 |
| JP | 2004-356207 A | 12/2004 |

OTHER PUBLICATIONS

Tetsuo Endoh et al., "New Stacked-Surrounding Gate Transistor (S-SGT) Structured Cell for Future Ultra High Density Flash Memory", ISTC 2002, No. 39, pp. 36-47.

(Continued)

*Primary Examiner*—George Fourson
(74) *Attorney, Agent, or Firm*—Foley & Lardner LLP

(57) ABSTRACT

A method of manufacturing a semiconductor device includes forming a mask layer on a semiconductor substrate, etching the semiconductor substrate using the mask layer as a mask, thereby forming a semiconductor pillar, doping an impurity into the semiconductor substrate, thereby forming a first source/drain region in part of the semiconductor substrate, which is located under the semiconductor pillar, forming a gate insulating film on the semiconductor substrate, which contacts a side surface of the semiconductor pillar, forming a gate electrode on a side surface of the gate insulating film, forming a first insulating layer on the gate electrode, which contacts a side surface of the semiconductor pillar, and doping the impurity into the first insulating layer, thereby forming a second source/drain region in part of the semiconductor pillar, which is located on a side surface of the first insulating layer.

20 Claims, 22 Drawing Sheets

OTHER PUBLICATIONS

Tetsuo Endoh et al., "Novel Ultra High Density Flash Memory with a Stacked-Surrounding Gate Transistor (S-SGT) Structured Cell", IEDM 2001.

Hiroshi Sakuraba et al., "New Three Dimensional High Density S-SGT Flash Memory Architecture using Self-Aligned Interconnections Fabricating Technology without Photo Lithography Process for Tera Bits and Beyond", SSDM 2003, Tokyo, pp. 642-643.

Hiroshi Takato et al., "Impact of Surrounding Gate Transistor (SGT) for Ultra-High-Density LSI's", IEEE Transactions on Electron Devices, vol. 38, No. 3, Mar. 1991, pp. 573-578.

* cited by examiner

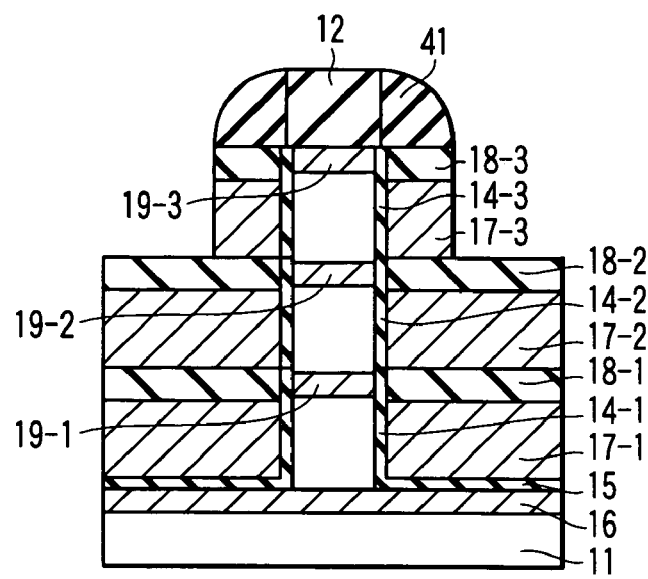
F I G. 4 6
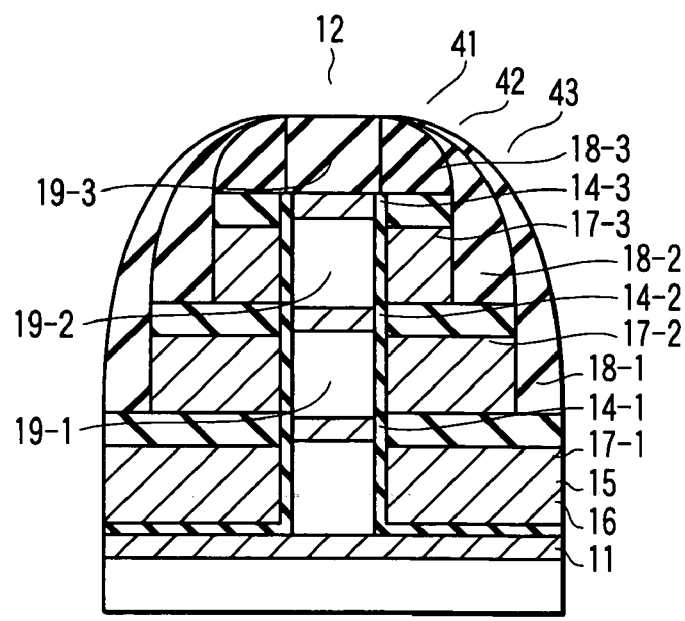
F I G. 4 7

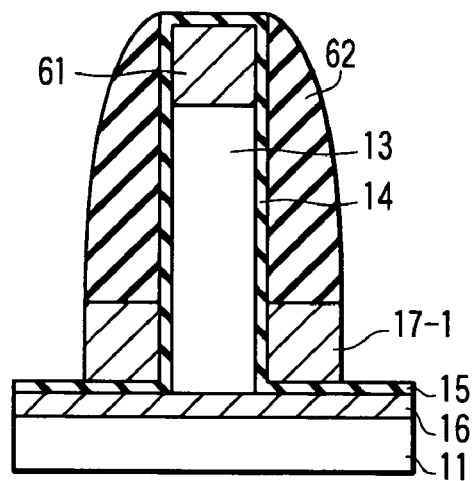
F I G. 61
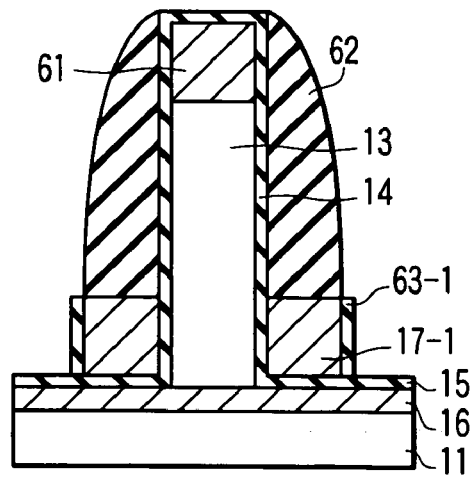
F I G. 62

Control gate electrode
Floating gate electrode

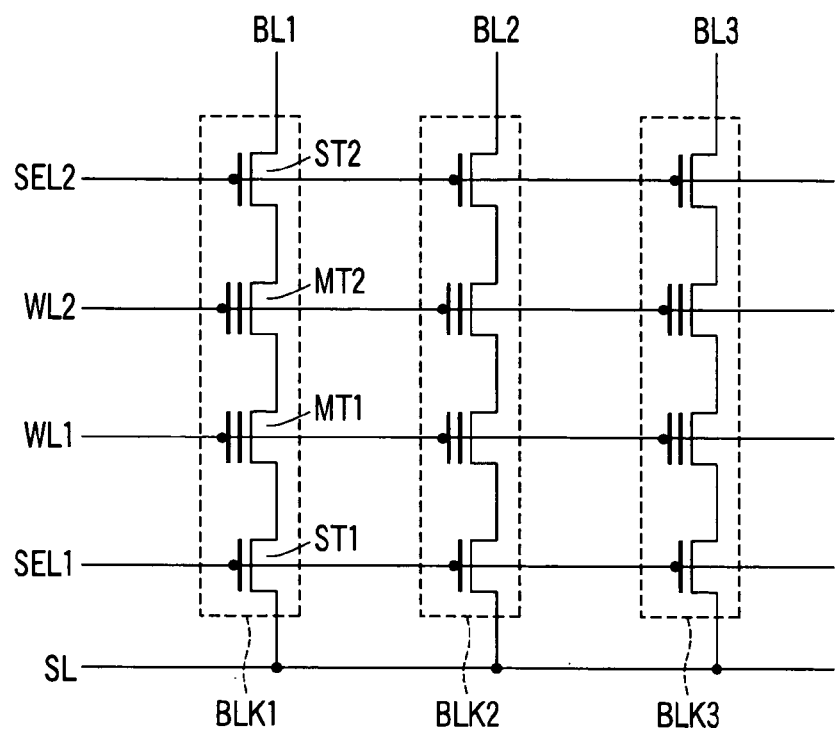
F I G. 67
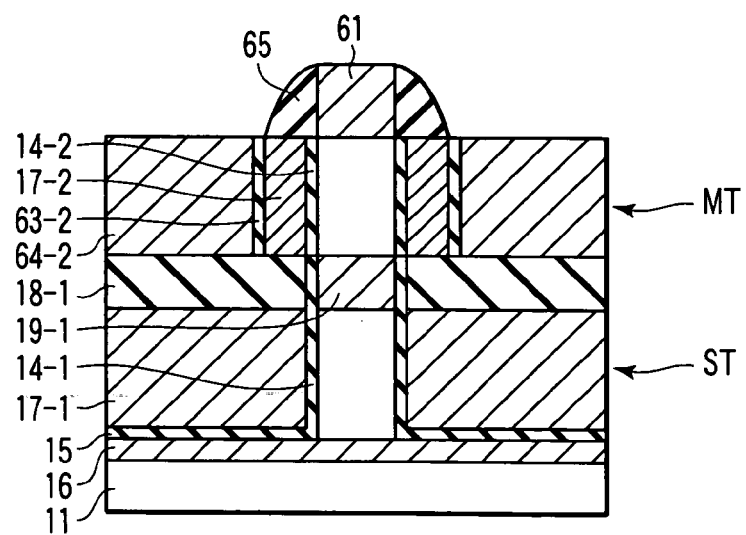
F I G. 68

SEMICONDUCTOR MANUFACTURING METHOD AND SEMICONDUCTOR DEVICE

CROSS-REFERENCE TO RELATED APPLICATIONS

This application is based upon and claims the benefit of priority from prior Japanese Patent Application No. 2005-133330, filed Apr. 28, 2005, the entire contents of which are incorporated herein by reference.

BACKGROUND OF THE INVENTION

1. Field of the Invention

The present invention relates to a semiconductor device and a method of manufacturing the same, and in particular a semiconductor device provided with a metal semiconductor field effect transistor (MOSFET) and a method of manufacturing the same.

2. Description of the Related Art

As a kind of MOSFET, a surrounding gate transistor (SGT) is known. To be more specific, this SGT is a MOSFET in which a source region, a gate region and a drain region are arranged vertically, and the gate electrode surrounds a silicon pillar (as disclosed in literature 1 (Takato, H, Sunouchi, K, et al., "Impact of Surrounding Gate Transistor (SGT) for ultra-high-density LSI's", IEEE Transaction of Electron Devices, Vol. 38, No. 3, March 1991). Furthermore, a stacked-surrounding gate transistor (S-SGT) is known in which two or more SGTs are stacked together (as disclosed in literature 2 (T. Endoh et al., TOHOKU University, Sharp Corporation, "Novel Ultra High Density Flash Memory with A Stacked-Surrounding Gate Transistor (S-SGT) Structured Cell", IEDM-2001).

In the case of forming such an S-SGT, in general, SGTs are successively formed downwards from the uppermost one. To be more specific, first, at an upper stage, a semiconductor pillar is formed, and an SGT is formed by using the semiconductor pillar; and then, at a subsequent stage, another semiconductor pillar which is larger in diameter than the above semiconductor pillar at the upper stage is formed, and another SGT is formed by using the other semiconductor pillar.

However, when an S-SGT is formed in the above manner, the diameters of semiconductor pillars for SGTs are different from each other such that the diameter of the upper one of any adjacent two of the semiconductor pillars is smaller than that of the other, that is, the diameter of the semiconductor pillar varies from one semiconductor pillar to another to gradually increase downwards. Inevitably, the place for providing the S-SGT is increased. Furthermore, since the diameters of the semiconductor pillars, which serve as channel regions, are different from each other as stated above, the SGTs respectively formed by using the semiconductor pillars have different characteristics.

Furthermore, it should be noted that in order that contact plugs be electrically connected to gate electrodes, a tiered structure of the S-SGT in which the SGTs are arranged in a stepwise manner is utilized, i.e., the steps of the S-SGT are utilized. Thus, as the number of the SGTs increases, the area of the place for providing the formed S-SGT increases. On the other hand, in a single SGT, after a gate electrode is formed, it is extended (that is, a conductive layer is added which is electrically connected to the gate electrode), and a contact plug is then formed. In this case, when the conductive layer is formed, the following positioning error easily occurs: for example, the conductive layer is not connected to the gate electrode, or it is formed in the semiconductor pillar. Therefore, a contact plug cannot be formed.

BRIEF SUMMARY OF THE INVENTION

According to a first aspect of the present invention, there is provided a method of manufacturing a semiconductor device, comprising: forming a mask layer on a semiconductor substrate; etching the semiconductor substrate using the mask layer as a mask, thereby forming a semiconductor pillar; doping an impurity into the semiconductor substrate, thereby forming a first source/drain region in part of the semiconductor substrate, which is located under the semiconductor pillar; forming a gate insulating film on the semiconductor substrate, which contacts a side surface of the semiconductor pillar, and surrounds the semiconductor pillar; forming a gate electrode on a side surface of the gate insulating film; forming a first insulating layer on the gate electrode, which contacts a side surface of the semiconductor pillar, and surrounds the semiconductor pillar; and doping the impurity into the first insulating layer, thereby forming a second source/drain region in part of the semiconductor pillar, which is located on a side surface of the first insulating layer.

According to a second aspect of the present invention, there is provided a method of manufacturing a semiconductor device, comprising: forming a mask layer on a semiconductor substrate; etching the semiconductor substrate using the mask layer as a mask, thereby forming a semiconductor pillar; and forming each of a plurality of MOS transistors in the semiconductor pillar and on a side surface of the semiconductor pillar, such that the MOS transistors are stacked together. The forming the each of the plurality of MOS transistors includes: forming a first insulating layer which contacts a side surface of the semiconductor pillar, and surrounds the semiconductor pillar; doping an impurity into the first insulating layer, thereby forming a first source/drain region in part of the semiconductor pillar, which is located on a side surface of the first insulating layer; forming a gate insulating film on the first insulating layer, which contacts a side surface of the semiconductor pillar, and surrounds the semiconductor pillar; forming a gate electrode on a side surface of the gate insulating film; forming a second insulating layer on the gate electrode, which contacts a side surface of the semiconductor pillar, and surrounds the semiconductor pillar; and doping the impurity into the second insulating layer, thereby forming a second source/drain region in part of the semiconductor pillar, which is located on a side surface of the second insulating layer.

According to a third aspect of the present invention, there is provided a method of manufacturing a semiconductor device, comprising: forming a mask layer on a semiconductor substrate; etching the semiconductor substrate using the mask layer as a mask, thereby forming a semiconductor pillar; and forming each of a plurality of memory cells in the semiconductor pillar and on a side surface of the semiconductor pillar, such that the memory cells are stacked together. The forming the each of the plurality of memory cells includes: forming a first insulating layer which contacts a side surface of the semiconductor pillar, and surrounds the semiconductor pillar; doping an impurity into the first insulating layer, thereby forming a first source/drain region in part of the semiconductor pillar, which is located on a side surface of the first insulating layer; forming a gate insulating film on the first insulating layer, which contacts a side surface of the semiconductor pillar, and surrounds the semiconductor pillar; forming a charge-storage layer on a side surface of the gate insulating film; forming a gate-to-gate insulating film on a side surface of the charge-storage layer; forming a control gate electrode on a side surface of the gate-to-gate insulating film; forming a second insulating layer on the charge-storage layer, the gate-to-gate insulating film and the control gate electrode, which contacts a side surface of the semiconductor pillar, and surrounds the semiconductor pillar; and doping the impurity into the second insulating layer, thereby forming a second source/drain region in part of the semiconductor pillar, which is located on a side surface of the second insulating layer.

According to a fourth aspect of the present invention, there is provided a method of manufacturing a semiconductor device, comprising: forming a mask layer on a semiconductor substrate; etching the semiconductor substrate using the mask layer as a mask, thereby forming a semiconductor pillar; and forming a memory cell in the semiconductor pillar and on a side surface of the semiconductor pillar, the memory cell including a selection transistor and a memory cell transistor. The forming the memory cell includes: forming a first insulating layer which contacts a side surface of the semiconductor pillar, and surrounds the semiconductor pillar; doping an impurity into the first insulating layer, thereby forming a first source/drain region in part of the semiconductor pillar, which is located on a side surface of the first insulating layer; forming a first gate insulating film on the first insulating layer, which contacts a side surface of the semiconductor pillar, and surrounds the semiconductor pillar; forming a gate electrode on a side surface of the first gate insulating film; forming a second insulating layer on the gate electrode, which contacts a side surface of the semiconductor pillar, and surrounds the semiconductor pillar; doping the impurity into the second insulating layer, thereby forming a second source/drain region in part of the semiconductor pillar, which is located on a side surface of the second insulating layer; forming a second gate insulating film on the second insulating layer, which contacts a side surface of the semiconductor pillar, and surrounds the semiconductor pillar; forming a charge-storage layer on a side surface of the second gate insulating film; forming a gate-to-gate insulating film on a side surface of the charge-storage layer; forming a control gate electrode on a side surface of the gate-to-gate insulating film; forming a third insulating layer on the charge-storage layer, the gate-to-gate insulating film and the gate electrode, which contacts a side surface of the semiconductor pillar, and surrounds the semiconductor pillar; and doping the impurity into the third insulating layer, thereby forming a third source/drain region in part of the semiconductor pillar, which is located on a side surface of the third insulating layer.

According to a fifth aspect of the present invention, there is provided a semiconductor device comprising: a semiconductor substrate; a semiconductor pillar provided on the semiconductor substrate; and a plurality of MOS transistors provided in the semiconductor pillar and on a side surface of the semiconductor pillar, such that the MOS transistors are stacked together. Each of the MOS transistors includes (i) a first insulating layer which contacts a side surface of the semiconductor pillar, and surrounds the semiconductor pillar, (ii) a first source/drain region provided in part of the semiconductor pillar, which is located on a side surface of the first insulating layer, (iii) a gate insulating film provided on the first insulating layer, which contacts a side surface of the semiconductor pillar, and surrounds the semiconductor pillar, (iv) a gate electrode provided on a side surface of the gate insulating film; (v) a second insulating layer provided on the gate electrode, which contacts a side surface of the semiconductor pillar, and surrounds the semiconductor pillar, and (vi) a second source/drain region provided in part of the semiconductor pillar, which is located on a side surface of the second insulating layer; wherein an impurity concentration of the first insulating layer is substantially equal to that of the first source/drain region; and an impurity concentration of the second insulating layer is substantially equal to that of the second source/drain region.

According to a sixth aspect of the present invention, there is provided a semiconductor device comprising: a semiconductor substrate; a semiconductor pillar provided on the semiconductor substrate; and a plurality of MOS transistors in the semiconductor pillar and on a side surface of the semiconductor pillar, such that the MOS transistors are stacked together. Each of the MOS transistors includes (i) a first insulating layer which contacts a side surface of the semiconductor pillar, and surrounds the semiconductor pillar, (ii) a first source/drain region provided in part of the semiconductor pillar, which is located on a side surface of the first insulating layer, (iii) a gate insulating film provided on the first insulating layer, which contacts a side surface of the semiconductor pillar, and surrounds the semiconductor pillar, (iv) a charge-storage layer provided on a side surface of the gate insulating film; (v) a gate-to-gate insulating film provided on a side surface of the charge-storage layer, (vi) a control gate electrode provided on a side surface of the gate-to-gate insulating film, (vii) a second insulating layer provided on the charge-storage layer, the gate-to-gate insulating film and the control gate electrode, which contacts a side surface of the semiconductor pillar, and surrounds the semiconductor pillar, and (viii) a second source/drain region provided in part of the semiconductor pillar, which is located on a side surface of the second insulating layer.

BRIEF DESCRIPTION OF THE SEVERAL VIEWS OF THE DRAWING

FIG. 46 is a vertical sectional view for use in explaining a step subsequent to a step in the manufacturing method which is to be explained with reference to FIG. 45.

FIG. 47 is a vertical sectional view for use in explaining a step subsequent to the step in the manufacturing method which is to be explained with reference to FIG. 46.

FIG. 61 is a vertical sectional view for use in explaining a step subsequent to the step in the manufacturing method which is to be explained with reference to FIG. 60.

FIG. 62 is a vertical sectional view for use in explaining a step subsequent to the step in the manufacturing method which is to be explained with reference to FIG. 61.

FIG. 67 is a circuit diagram of the flash memory shown in FIGS. 65 and 66.

FIG. 68 is a vertical sectional view of a flash memory in which each of flash memory cells MC comprises a memory cell transistor MT and a selection transistor ST.

DETAILED DESCRIPTION OF THE INVENTION

Figure 1:
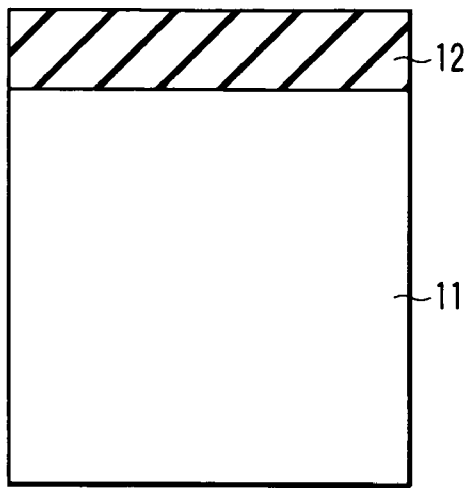
FIG. 1 is a vertical sectional view for use in explaining an example of a manufacturing method of a semiconductor device in a first embodiment of the present invention.

Embodiments of the present invention will be explained with reference to the accompanying drawings. In the following explanations, structural elements having the same functions and same structures will be denoted by the same reference numerals, respectively. After they are each explained one time, their explanations will not be repeated, except as need arises.

First Embodiment

An example of a method of manufacturing a semiconductor device according to a first embodiment of the present invention will be explained with references to FIGS. 1 to 16. As shown in FIG. 1, a p-type semiconductor substrate 11 is prepared. In the first embodiment, a bulk Si substrate is used as the p-type semiconductor substrate 11.

Figure 2:
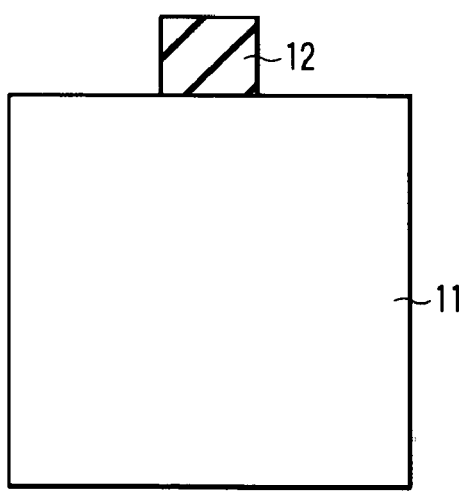
FIG. 2 is a plan view for use in explaining a step subsequent to a step in the manufacturing method which is to be explained with reference to FIG. 1.

On the semiconductor substrate 11, a mask layer 12 (e.g., SiN), which is an insulator, is deposited by, e.g., a chemical vapor deposition (CVD) method. Then, as shown in FIG. 2, the mask layer 12 is etched by lithography and a reactive ion etching (RIE) method in such a manner as to have the same plan configuration (e.g., circle) as a semiconductor pillar 13 which will be described later.

It should be noted that the mask layer 12 need not be formed of one layer, i.e., it may be formed of a number of layers. For example, it may be formed by successively stacking an SiO$_2$ layer and an SiN layer on the semiconductor layer 12.

Figure 3:
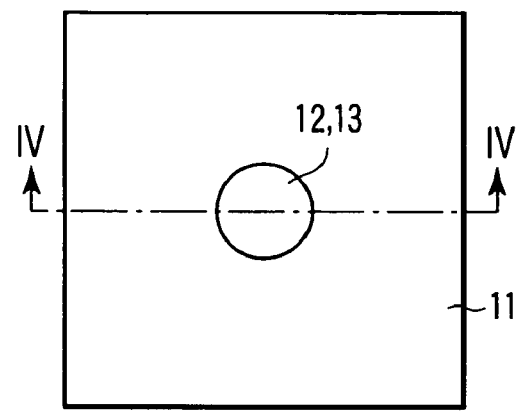
FIG. 3 is a plan view for use in explaining a step subsequent to the step in the manufacturing method which is to be explained with reference to FIG. 2.
Figure 4:
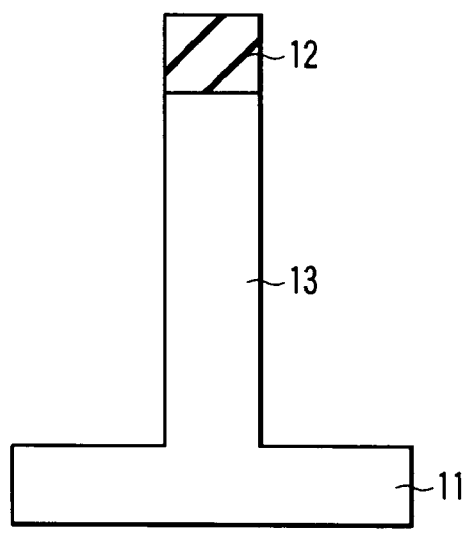
FIG. 4 is a vertical sectional view taken along line IV—IV in FIG. 3.

Next, as shown in FIG. 3 (plan view) and FIG. 4 (vertical-sectional view taken along line IV—IV in FIG. 3), the semiconductor substrate 11 is etched to a predetermined depth by, e.g., the RIE method, with the mask layer 12 used as a mask. Thereby, in the semiconductor substrate 11, a semiconductor pillar 13 having a circular plan configuration and a groove are formed at the same time due to etching. The semiconductor pillar 13 has a diameter of, e.g., 50 nm. It should be noted that the plan configuration of the semiconductor pillar 13 need not be circular, that is, it may be, e.g., rectangular.

Figure 5:
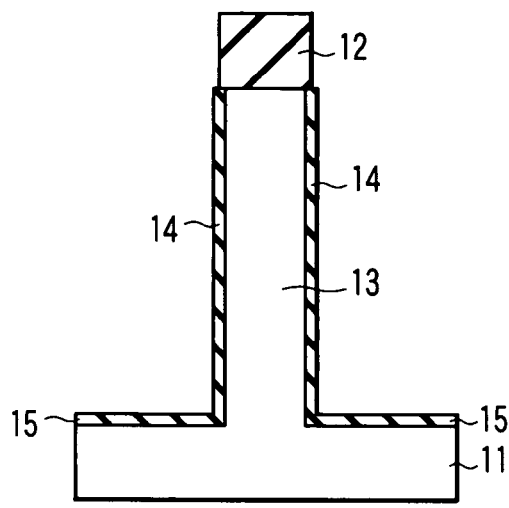
FIG. 5 is a vertical sectional view for use in explaining a step subsequent to the step in the manufacturing method which is to be explained with reference to FIG. 3.

Then, as shown in FIG. 5, SiO$_2$ is deposited on an upper surface of the semiconductor substrate 11 and a side surface of the semiconductor pillar 13 by using, e.g., the CVD method. As a result, an oxide film 14 and an oxide film 15 are formed on the side surface of the semiconductor pillar 13 and the upper surface of the semiconductor substrate 11, respectively. The oxide film 14 will become a gate insulating film later. It should be noted that the method for forming the oxide films 14 and 15 is not limited to the CVD method, that is, they may be formed by using a thermal oxidization method.

Figure 6:
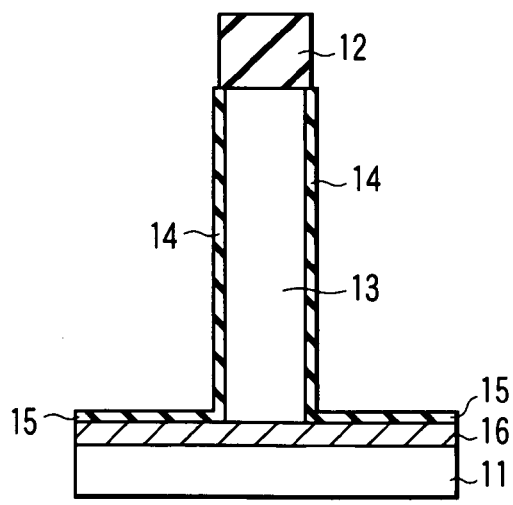
FIG. 6 is a vertical sectional view for use in explaining a step subsequent to the step in the manufacturing method which is to be explained with reference to FIG. 5.

Next, as shown in FIG. 6, an n-type impurity (e.g., arsenic) of a high concentration is doped into the semiconductor substrate 11 (this is, ion implantation is carried out), thereby forming a source/drain region 16 in a surface region of the semiconductor substrate 11, which includes at least a region of the semiconductor substrate 11 which is located below the semiconductor pillar 13. Then, heat treatment (annealing) is carried out to correct crystal defects, and electrically activate the implanted impurity ions. The above ion implantation is carried out in, e.g., a direction perpendicular to the semiconductor substrate 11. Ideally, the ion implantation should be applied in a vertical direction; however, it may be applied in a direction slightly deviating from the vertical direction, since apparatuses for manufacturing semiconductor devices vary. To be more specific, the ion implantation may be applied at any angle as long as a large number of impurity ions are not implanted directly into the side surface of the semiconductor pillar 13. The same is true of ion implantation steps which will be described later.

In the first embodiment, as stated above, the source/drain region 16 is formed in the surface region of the semiconductor substrate 11, which includes at least the region of the semiconductor substrate 11 which is located below the semiconductor pillar 13. However, it need not be formed in a center portion of the above region of the semiconductor substrate 11. That is, the source/drain region 16 may be formed to surround the above part of the semiconductor pillar 13 (which is located below the above center portion thereof). Whether or not the source/drain region 16 is formed in such a manner depends on a condition, e.g., the diameter of the semiconductor pillar 13 and how impurity ions are implanted (their dosage and acceleration voltage, etc).

To be more specific, if the diameter of the semiconductor pillar 13 is large, impurity ions implanted into part of the semiconductor substrate 11 which is located in the vicinity of the semiconductor pillar 13 do not reach the center portion of the above region of the semiconductor substrate 11. Consequently, a source/drain region 16 is not located in the center portion of the above region of the semiconductor substrate 11. The same is true of the case where the dosage of impurity ions is small.

Furthermore, the method for forming the source/drain region 16 is not limited to the above method. That is, to form the source/drain region 16, the following method may be applied: an insulating layer having a desired thickness is formed on the semiconductor substrate to cover a lower portion of the semiconductor pillar 13, and n+-type impurity ions of a high concentration are implanted into the insulating layer, as a result of which the implanted impurity ions are diffused from the insulating layer into the semiconductor pillar 13, thereby forming a source/drain region 16 on a lower portion of the semiconductor pillar 13.

Figure 7:
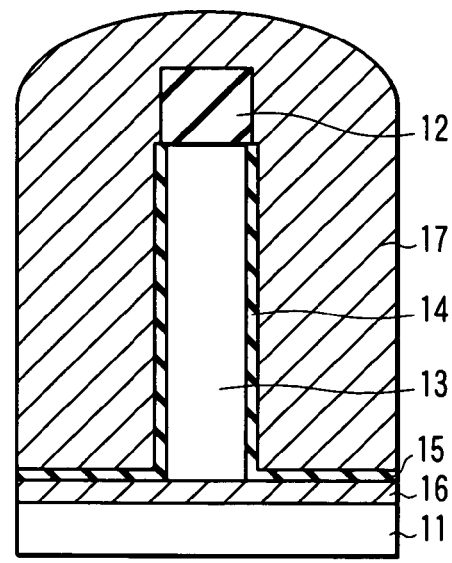
FIG. 7 is a vertical sectional view for use in explaining a step subsequent to the step in the manufacturing method which is to be explained with reference to FIG. 6.
Figure 8:
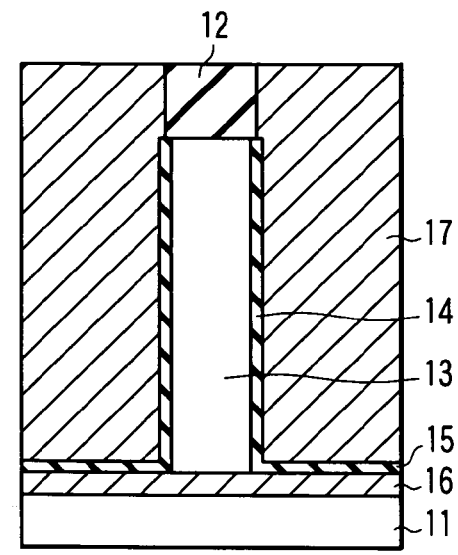
FIG. 8 is a vertical sectional view for use in explaining a step subsequent to the step in the manufacturing method which is to be explained with reference to FIG. 7.

Next, as shown in FIG. 7, a conductor 17 (e.g., polysilicon containing n-type impurity doped thereinto) is deposited on the semiconductor substrate 11 to cover the mask layer 12 by using, e.g., the CVD method. In this case, suppose the conductor 17 is a polysilicon layer 17. Then, as shown in FIG. 8, the surface of the polysilicon layer 17 is flattened by a chemical mechanical polishing (CMP) method.

Figure 9:
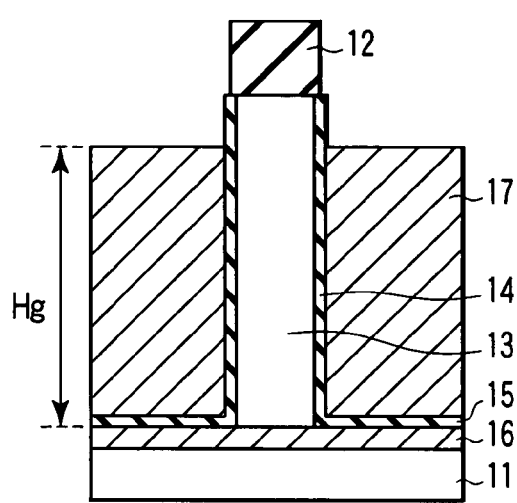
FIG. 9 is a vertical sectional view for use in explaining a step subsequent to the step in the manufacturing method which is to be explained with reference to FIG. 8.

Thereafter, the polysilicon layer 17 is etched by the RIE method such that its level is coincident with that of a channel region in the semiconductor pillar 13, i.e., it has a height Hg, as shown in FIG. 9. The height Hg of the polysilicon layer 17 is set such that the level thereof is lower than the top of the semiconductor pillar 13. As a result, the polysilicon layer 17 serves as a gate electrode 17 surrounding the channel region of the semiconductor pillar 13.

Figure 11:
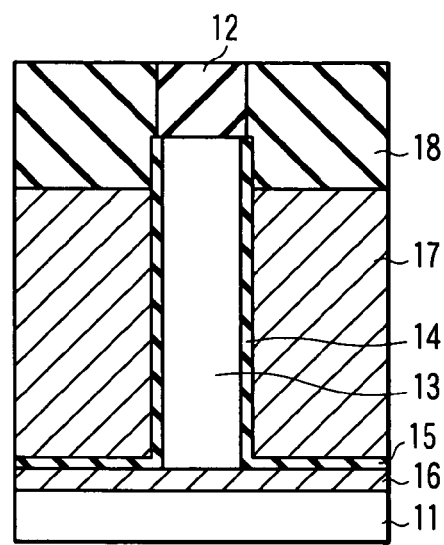
FIG. 11 is a vertical sectional view for use in explaining a step subsequent to the step in the manufacturing method which is to be explained with reference to FIG. 10.
Figure 10:
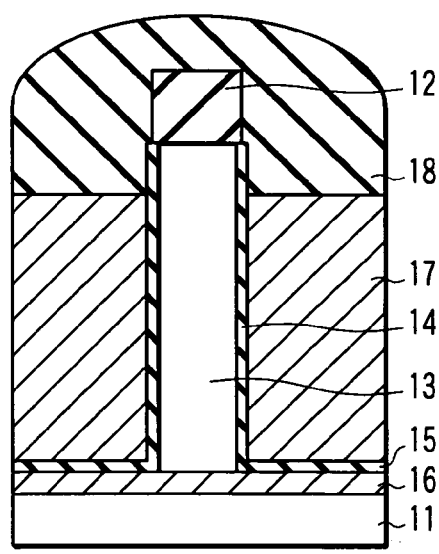
FIG. 10 is a vertical sectional view for use in explaining a step subsequent to the step in the manufacturing method which is to be explained with reference to FIG. 9.

Next, as shown in FIG. 10, an insulating layer 18 is deposited on the gate electrode 17 to cover the mask layer 12, by using, e.g., the CVD method. The insulating layer 18 is formed of SiN, $SiO_2$ and TEOS (Tetra-Ethyl-Ortho-Silicate), etc. The surface of the insulating layer 18, as shown in FIG. 11, is flattened by the CMP method. The insulating layer 18 serves as an interlayer insulating film.

Figure 12:
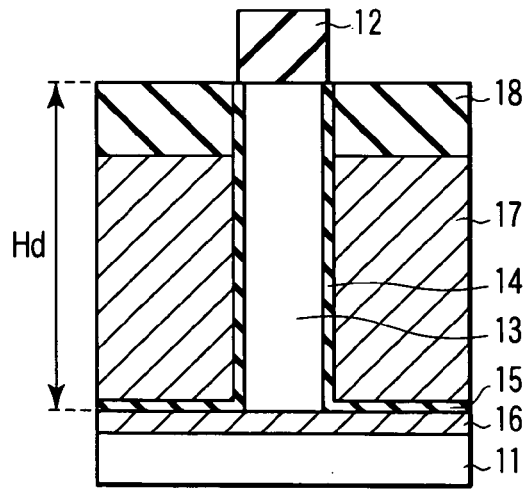
FIG. 12 is a vertical sectional view for use in explaining a step subsequent to the step in the manufacturing method which is to be explained with reference to FIG. 11.

Then, as shown in FIG. 12, the insulating layer 18 is etched by the RIE method such that the distance from the surface of the semiconductor substrate 11 to that of the insulating layer 18 is coincident with a height Hd, as shown in FIG. 12 (in the first embodiment, the height Hd is set such that the level of the insulating layer 18 is coincident with that of the semiconductor pillar 13). In such a manner, the insulating layer 18 is located on a desired portion to contact the side surface of the semiconductor pillar 13, and also surround the semiconductor pillar 13.

Figure 13:
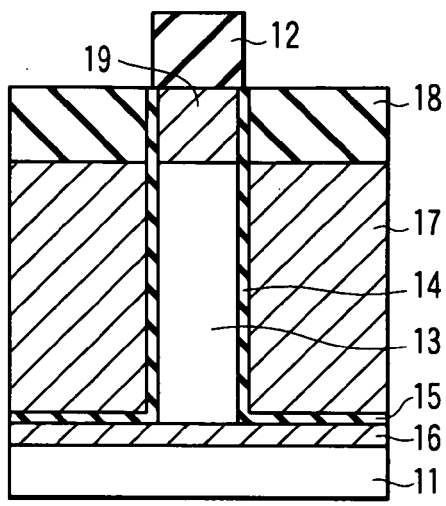
FIG. 13 is a vertical sectional view for use in explaining a step subsequent to the step in the manufacturing method which is to be explained with reference to FIG. 12.

Next, as shown in FIG. 13, n+-type impurity ions of a high concentration are implanted into the insulating layer 18. The implanted impurity ions diffuse from the insulating layer 18 to an upper portion of the semiconductor pillar 13. Thereby, a source/drain region 19 is formed in the upper portion of the semiconductor pillar 13 in a position corresponding to that of the side surface of the insulating layer 18. In this ion implantation, the impurity is, e.g., arsenic, the acceleration voltage is approximately 5 keV, and the implantation angle of the impurity ions is approximately 0° (that is, the impurity ions are implanted in a direction perpendicular to the substrate 11). Then, heat treatment (annealing) is performed in order to correct crystal defects, and electrically activate the implanted impurity ions.

As stated above, the acceleration voltage is set at approximately 5 keV, that is, it is very small. It suffices that the acceleration voltage is set such that the level of a region whose impurity concentration is peak in the ion-implanted region is located in the insulating layer 18. That is, the insulating layer 18 includes a portion whose impurity concentration is peak in the ion-implanted region. Also, it suffices that the implanted impurity ions do not pass through the insulating layer 18. In such a manner, the impurity ions implanted in the insulating layer 18 diffuse, as a result of which the source/drain region 19 is formed in the upper portion of the semiconductor pillar 13.

Furthermore, the level of part of the source/drain region 19, whose impurity concentration is peak in the source/drain region 19, is substantially coincident with that of part of the insulating layer 18, whose impurity concentration is peak in the insulating layer 18. This is because impurity ions are implanted into the insulating layer 18 in order to form the source/drain region 19. Such a phenomenon is specific to the source/drain region 19 formed by using the manufacturing method according to the first embodiment.

Figure 14:
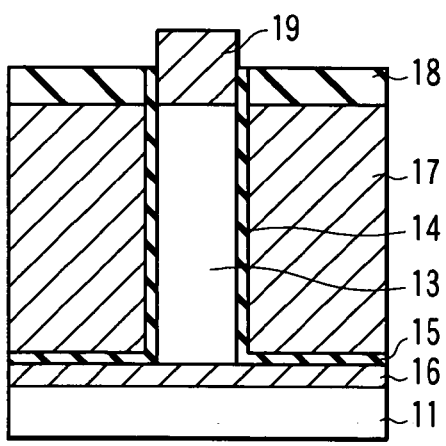
FIG. 14 is a vertical sectional view for use in explaining a step subsequent to the step in the manufacturing method which is to be explained with reference to FIG. 13.

Next, as shown in FIG. 14, the mask layer 12 is etched by the RIE method. Further, part of the insulating layer 18 is etched by using the RIE method. Consequently, the source/drain region 19 is exposed.

Figure 15:
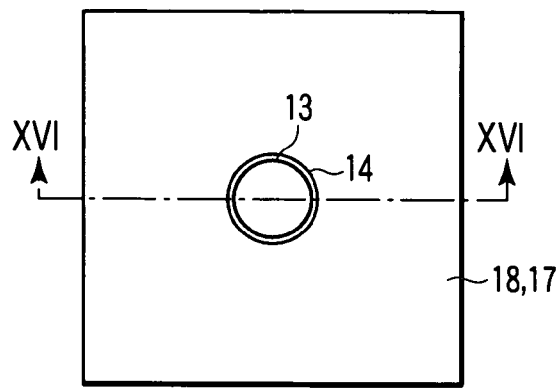
FIG. 15 is a vertical sectional view for use in explaining a step subsequent to the step in the manufacturing method which is to be explained with reference to FIG. 14.

Then, the gate electrode 17 and the insulating layer 18 are etched by lithography such that the plan configuration of each of the gate electrode 17 and the insulating layer 18 is shaped to be, e.g., rectangular as shown in FIG. 15 (plan view). To be more specific, a resist film (not shown) is formed on the semiconductor pillar 13 and the insulating layer 18 in such a manner as to have the same plan configuration as the gate electrode 17. Then, the gate electrode 17 and the insulating film 18 are etched by the RIE method, with the resist film used as a mask. Thereafter, the resist film is removed.

In such a manner, the gate electrode 17 and the insulating layer 18 are shaped to have such a rectangular as shown in FIG. 15. It should be noted that the plan configuration of the gate electrode 17 need not be rectangular. That is, for example, it may be circular, square, or polygonal. It can be shaped in an arbitrary form by changing the plan configuration of the resist film.

Figure 16:
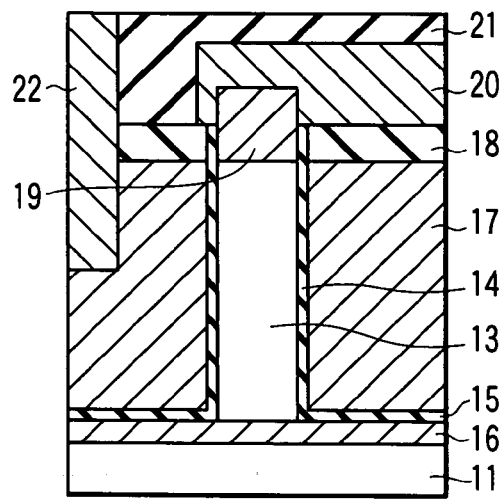
FIG. 16 is a vertical sectional view for use in explaining a step subsequent to the step in the manufacturing method which is to be explained with reference to FIG. 15.

Next, as shown in FIG. 16 (vertical sectional view taken along line XVI—XVI in FIG. 15), a metal layer 20 is formed to be electrically connected to the source/drain region 19. Further, an interlayer insulating film 21 (for example, $SiO_2$) is deposited on the metal layer 20 and the insulating film 18 by the CVD method.

Next, a contact hole is formed in the interlayer insulating film 21 and the insulating film 18 in such a manner as to expose part of the gate electrode 17. Then, the contact hole is filled with metal, thereby forming a contact plug 22, which is electrically connected to the gate electrode 17. The metal layer 20 and the contact plug 22 are formed of Cu, Al and W, etc. In such a manner, a surrounding gate transistor (SGT) is formed in which the gate electrode 17 is provided to surround the semiconductor pillar 13.

As explained above in detail, according to the first embodiment, the source/drain region 19 can be formed in arbitrary part of the semiconductor pillar 13. Furthermore, when the manufacturing method according to the first embodiment is applied, an impurity can be doped into the resultant structure, while controlling dope of the impurity in the depth direction of the resultant structure, such that the concentration of the doped impurity is high, even if the diameter of the semiconductor pillar 13 is small.

Further, in order to form the contact plug 22 at the gate electrode 17, it is not necessary to provide a step of extend the gate electrode 17 (i.e., a step of providing a conductive layer electrically connected to the gate electrode 17) to ensure a contact region. Thus, the number of manufacturing steps can be decreased.

Furthermore, when the contact plug 22 is formed, the positioning margin is large. Thereby, the step of forming the contact plug 22 is not required to be carried out with a high accuracy. That is, the contact plug 22 can be easily formed.

It should be noted that a low-k film having a low dielectric constant may be used as the insulating layer of the first embodiment. For example, a porous film can serve as the low-k film. Use of the low-k film enables the wiring capacity to be decreased, thus improving the operation speed of the SGT.

Also, it should be noted that a high-k film having a high dielectric constant may be used as the gate insulating film. For example, an ON film in which a silicon oxide film and a silicon nitride film are stacked together can serve as the high-k film. In particular, it should be noted that the present invention enables a semiconductor device to be more minutely formed, and thus the tunnel current to be reduced in amount due to use of the high-k film. Accordingly, the leakage current of the SGT can be reduced. The same advantage can be obtained as in the case where the low-k and high-k films are used in other embodiments which will be explained later.

In addition, in the first embodiment, an n-type metal oxide semiconductor (MOS) transistor is formed by using a p-type semiconductor substrate and a $n^+$-type impurity. However, a p-type MOS transistor may be formed by using an n-type semiconductor substrate and a $p^+$-impurity. The method for forming the p-type MOS transistor is the same as that for forming the n-type MOS transistor, except for changing the conductivity of each of the applied impurity and the semiconductor substrate.

Second Embodiment

In the second embodiment, a number of SGTs are stacked together in the vertical direction to form an SGT (stacked-surrounding gate transistor).

Figure 17:
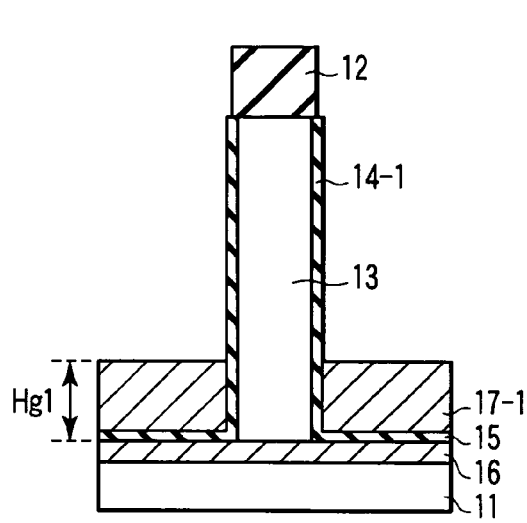
FIG. 17 is a vertical sectional view for use in explaining an example of a manufacturing method of a semiconductor device in a second embodiment of the present invention.

An example of a method of manufacturing a semiconductor device according to the second embodiment of the present invention will be explained with reference to FIGS. 17 to 26. It should be noted that in the second embodiment, the same manufacturing steps as in the first embodiment, explained by referring to FIGS. 1 to 8, are carried out, and then the following steps are carried out:

As shown in FIG. 17, the surface of the polysilicon layer 17 is etched by the RIE method to have a height Hg1 from the upper surface of the semiconductor substrate 11, thereby forming a gate electrode 17-1 serving as a first SGT.

Figure 19:
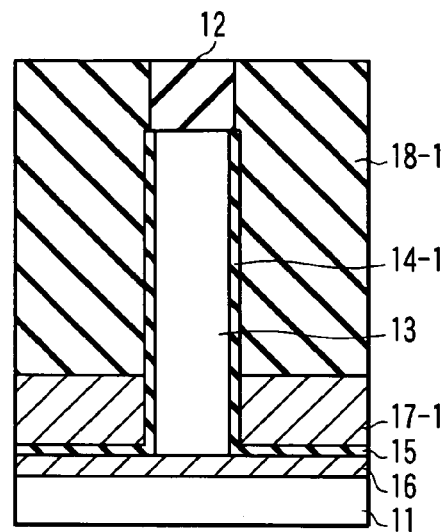
FIG. 19 is a vertical sectional view for use in explaining a step subsequent to the step in the manufacturing method which is to be explained with reference to FIG. 18.
Figure 18:
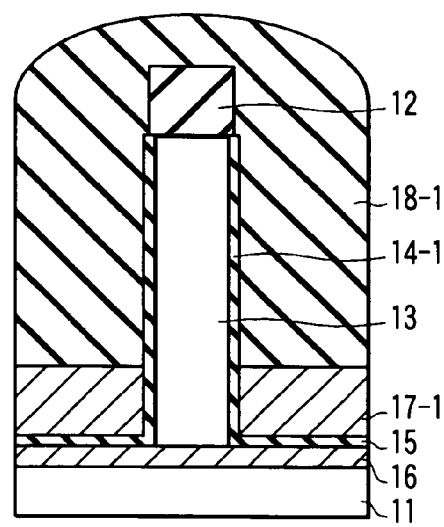
FIG. 18 is a vertical sectional view for use in explaining a step subsequent to a step in the manufacturing method which is to be explained with reference to FIG. 17.

Then, by using, e.g., the CVD method, an insulating layer 18-1 is deposited on the gate electrode 17-1 to cover the mask layer 12. The insulating film 18-1 is formed of SiN, $SiO_2$ and TEOS, etc. The upper surface of the insulating layer 18-1 is flattened by the CMP method as shown in FIG. 19.

Figure 20:
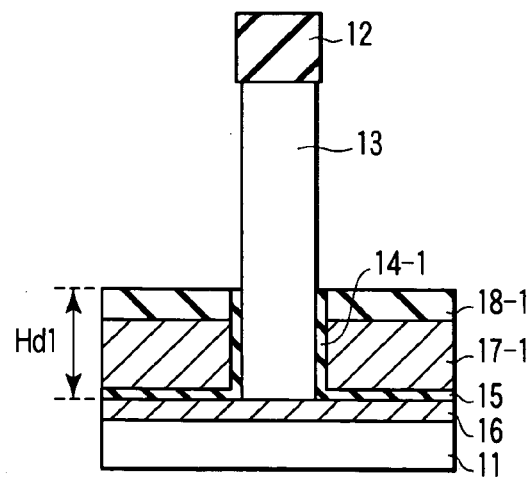
FIG. 20 is a vertical sectional view for use in explaining a step subsequent to the step in the manufacturing method which is to be explained with reference to FIG. 19.

Next, as shown in FIG. 20, the insulating layer 18-1 and an oxide film (gate insulating film) 14-1 are etched such that the insulating layer 18-1 has a height Hd1 from the upper surface of the semiconductor substrate 11.

Figure 21:
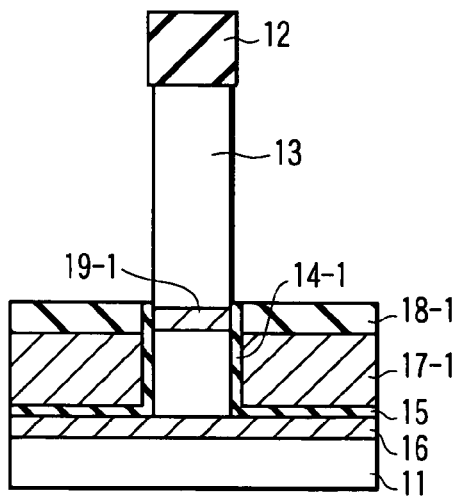
FIG. 21 is a vertical sectional view for use in explaining a step subsequent to the step in the manufacturing method which is to be explained with reference to FIG. 20.

Then, as shown in FIG. 21, $n^+$-type impurity ions of a high concentration are implanted into the insulating layer 18-1, and are diffused therefrom into the semiconductor pillar 13. Thereby, a source/drain region 19-1 is formed in the semiconductor pillar 13 in a position corresponding to that of the side surface of the insulating layer 18-1. This ion implantation step is the same as that in the first embodiment. In the second embodiment also, it is carried out such that the insulating layer 18 includes a portion whose impurity concentration is peak in the ion-implanted region. Then, annealing is performed to correct crystal defects, and electrically activate the implanted impurity ions.

In the above manner, the impurity ions implanted into the insulating layer 18-1 are diffused, and the source/drain region 19-1 are formed in part of the semiconductor pillar 13, which is located in a position corresponding to that of the insulating layer 18-1. As a result, a first SGT is formed of the gate electrode 17-1, the gate insulating film 14-1, the source/drain regions 16 and 19-1.

Figure 22:
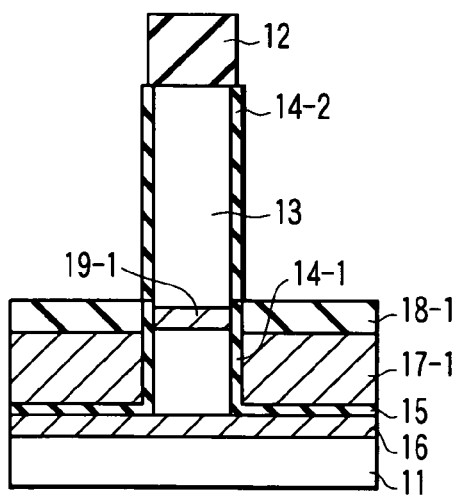
FIG. 22 is a vertical sectional view for use in explaining a step subsequent to the step in the manufacturing method which is to be explained with reference to FIG. 21.

Next, as shown in FIG. 22, $SiO_2$ is deposited on the side surface of the semiconductor pillar 13 by the CVD method. Thereby, an oxide film 14-2 is formed on the side surface of the semiconductor pillar 13. The oxide film 14-2 will become a gate insulating film of a second SGT later.

Figure 23:
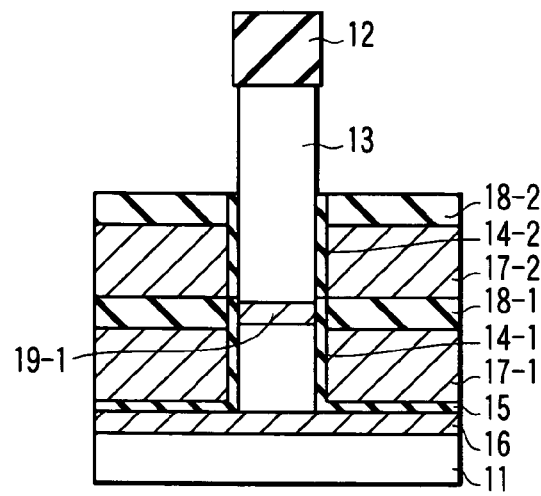
FIG. 23 is a vertical sectional view for use in explaining a step subsequent to the step in the manufacturing method which is to be explained with reference to FIG. 22.
Figure 24:
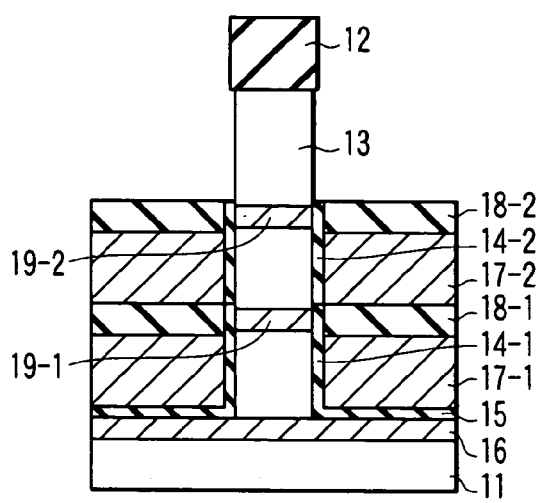
FIG. 24 is a vertical sectional view for use in explaining a step subsequent to the step in the manufacturing method which is to be explained with reference to FIG. 23.

Then, as shown in FIG. 23, a gate electrode 17-2, a gate insulating film 14-2 and an insulating layer 18-2 are formed in the same manner as those of the first SGT. Further, as shown in FIG. 24, $n^+$-impurity ions of a high concentration are implanted into the insulating layer 18-2, and the implanted impurity ions are diffused from the insulating layer 18-2 into the semiconductor pillar 13. Thereby, a source/drain region 19-2 is formed in part of the semiconductor pillar 13, which is located in a position corresponding to that of the insulating layer 18-2. Then, heat treatment (annealing) is carried out to correct crystal defects, and electrically activate the implanted impurity ions. In such a manner, a second SGT, which is formed of the gate electrode 17-2, the gate insulating film 14-2 and the source/drain regions 19-1 and 19-2, is provided on the first SGT.

Similarly, a gate electrode 17-3, a gate insulating film 14-3, an insulating layer 18-3 and a source/drain region 19-3 are formed. In such a manner, a third SGT, which is formed of the gate electrode 17-3, the gate insulating film 14-3, the insulating layer 18-3 and the source/drain region 19-2 and 19-3, is provided on the second SGT.

Figure 25:
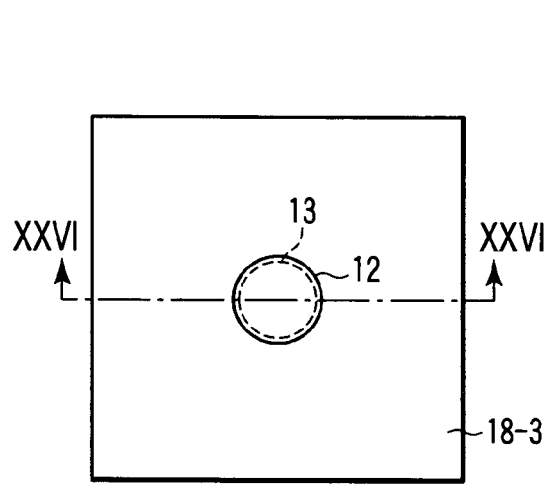
FIG. 25 is a vertical sectional view for use in explaining a step subsequent to the step in the manufacturing method which is to be explained with reference to FIG. 24.

Next, as shown in FIG. 25 (plan view) and 26 (vertical sectional view taken along line XXVI—XXVI in FIG. 25), gate electrodes 17-1, 17-2 and 17-3 and insulating layers 18-1, 18-2 and 18-3 are etched by lithography such that their plan configurations are shaped to be, e.g., rectangular. In such a manner, an S-SGT is formed to have a rectangular plan configuration.

In this S-SGT, the above the first to third SGTs are shaped to have the same plan configuration (see FIG. 25 (plan view)). Therefore, although the SGT includes a number of SGTs as stated above, the area of the place for providing the S-SGT is not increased. That is, according to the second embodiment, an S-SGT can be formed more minutely and at a higher integration density. The other advantages are the same as those of the first embodiment.

In addition to the above advantage, the second embodiment has the following advantages:

Since parts of the semiconductor pillar 13, at which the SGT are formed, respectively, have the same diameter, the S-SGT can be formed of a number of SGTs having the same characteristics.

Any adjacent two of the SGTs share an associated source/drain region. Thus, the S-SGT can be formed to have a smaller thickness in the vertical direction.

The above explanation of the second embodiment is given by referring to a SGT comprising three SGTs by way of example. However, the SGT may be formed of two SGTs, or four or more SGTs. In this case also, it can be formed without increasing the area of the place for providing it.

The insulating layers 18-1, 18-2 and 18-3 can be used as interlayer insulating films between the SGTs. Therefore, according to the second embodiment, it is not necessary to further form interlayer insulating films.

Also, in the second embodiment, the first to third SGTs are formed to include respective gate insulating films. As a result, the gate insulating films do not deteriorate, and can therefore serve as optimal gate insulating films, thus improving the transistor characteristics of the SGTs.

The oxide film 14-1 need not be etched. That is, the first to third SGTs may use the oxide film 14-1 formed at the side surface of the semiconductor pillar 13, as their common gate insulating film. As a result, the number of manufacturing steps can be reduced.

As stated above, the gate insulating film may be formed by using the thermal oxidization method. The gate insulating film formed by the thermal oxidization method need not be etched. Alternatively, in the manufacturing steps of the first to third SGTs, respective gate insulating films may be formed.

In the case where gate insulating films are respectively formed for the first to third SGTs, etching is carried out to remove surplus parts of oxide films in the manufacturing steps of the first to third SGTs. Thus, the diameters of any adjacent two of the SGTs are different from each other by approximately the thinness of each of the oxide films. Accordingly, an S-SGT can be formed without increasing the area of the place for providing it, such that the diameter of the upper one of any adjacent two of the SGTs is lower than that of the other. Also, it should be noted that the thickness of each of the oxide films (gate insulating films) is very thin. Therefore, even if the diameter of the semiconductor pillar 13 decreases upwards, it does not greatly influence on the transistor characteristics.

Furthermore, in the second embodiment, after being deposited, the gate electrodes 17-1, 17-2 and 17-3 are all processed with respect to plan configuration. This processing of the gate electrodes can be achieved by applying the manufacturing method of the present invention to formation of an SGT. For example, if gate electrodes are successively deposited and processed, that is, deposition and processing are performed in units of one gate electrode, the processed gate electrode have different thicknesses, and the thickness of each gate electrode is not uniform. Inevitably, when insulating layer for formation of source/drain region is deposited on the gate electrode having different thickness, this is also formed to have different thickness.

In this situation, when impurity ions are implanted into the insulating layers, desired source/drain regions cannot be formed. On the other hand, according to the second embodiment, desired source/drain regions can be formed, since insulating layers are deposited on the gate electrodes formed to have the same thickness.

Third Embodiment

The third embodiment relates to an example of a structure in which a gate electrode is formed to comprise two layers. A method of manufacturing a semiconductor device according to the third embodiment will be explained with reference to FIGS. 27 to 31. It should be noted that in the third embodiment, the manufacturing steps carried out until the structure shown in FIG. 27 is obtained are the same as those in the second embodiment, and then the following steps are carried out.

Figure 27:
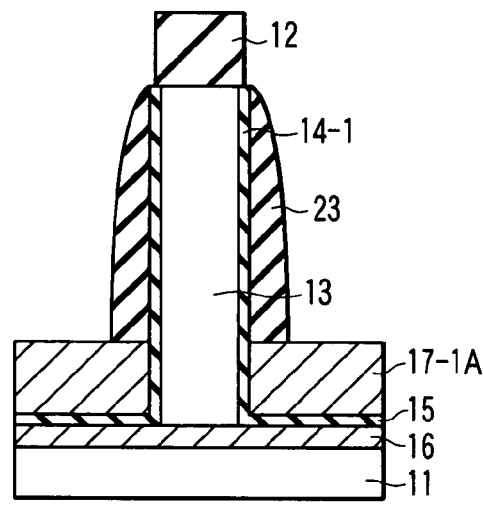
FIG. 27 is a vertical sectional view for use in explaining an example of a manufacturing method of a semiconductor device in a third embodiment of the present invention.
Figure 28:
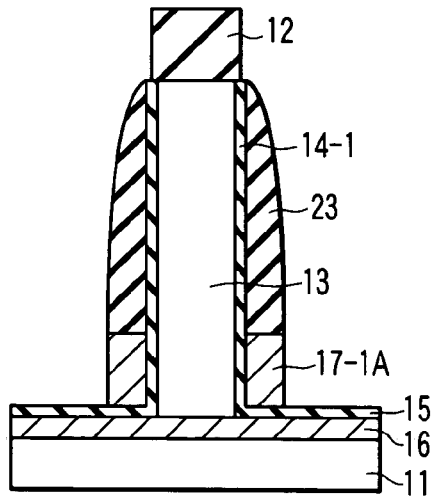
FIG. 28 is a vertical sectional view for use in explaining a step subsequent to a step in the manufacturing method which is to be explained with reference to FIG. 27.

As shown in FIG. 27, a side wall insulating film 23 is formed (e.g., it is formed of SiN). Then, as shown in FIG. 28, a polysilicon layer 17-1A is anisotropically etched, with the side wall insulating film 23 used as a mask.

Figure 29:
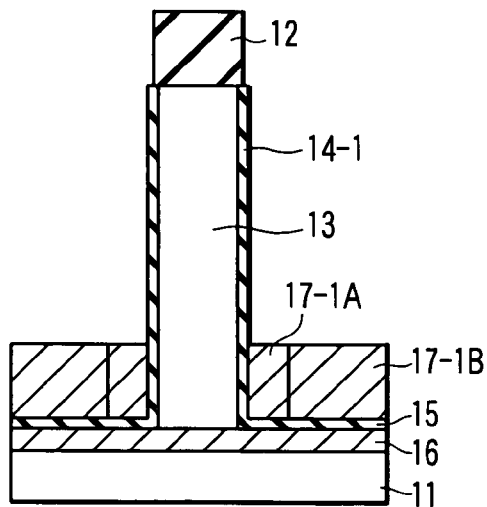
FIG. 29 is a vertical sectional view for use in explaining a step subsequent to the step in the manufacturing method which is to be explained with reference to FIG. 28.
Figure 31:
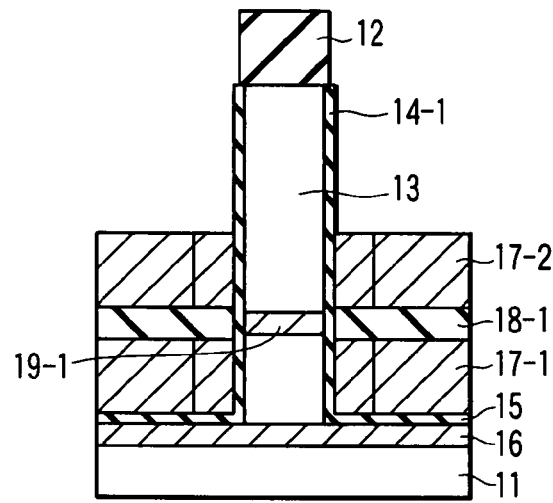
FIG. 31 is a vertical sectional view for use in explaining a step subsequent to the step in the manufacturing method which is to be explained with reference to FIG. 30.

Then, as shown in FIG. 29, on the oxide film 15, a metal layer 17-1B is formed on a side surface of the polysilicon layer 17-1A. In such a manner, a gate electrode 17-1 is formed to have a stacked gate structure (i.e., so-called polymetal structure) containing the polysilicon layer and the metal layer. The stacked gate structure of the gate electrode 17-1 is not limited to the above stacked gate structure of the polysilicon layer and the metal layer. That is, the gate electrode 17-1 may be formed to have a stacked gate structure (i.e., so-called polycide structure) of the polysilicon layer and a silicide layer. It should be noted that for example, TiN, W, WN, Ru, Ir or Al can be used as the metal layer, and $CoSi_2$ or $TiSi_2$ can be used as the silicide layer.

Figure 30:
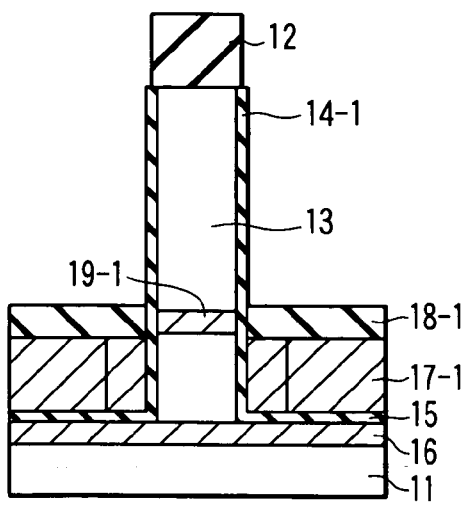
FIG. 30 is a vertical sectional view for use in explaining a step subsequent to the step in the manufacturing method which is to be explained with reference to FIG. 29.

Next, as shown in FIG. 30, an insulating layer 18-1 and a source/drain region 19-1 are formed. In such a manner, a first SGT is formed to have a stacked gate structure. Then, a gate electrode 17-2 is formed of a polysilicon layer 17-2A and a metal layer 17-2B (see FIG. 31). Thereafter, second and third SGTs are formed in the same manner as the first SGT.

As explained above, according to the third embodiment, an S-SGT having a stacked gate structure can be formed. Thus, the resistances of the gate electrodes can be reduced, and thus the operation speeds of the transistors can be improved.

Fourth Embodiment

The fourth embodiment relates to a structure in which an electrode is connected to a source/drain region. A method of manufacturing a semiconductor device according to the fourth embodiment will be explained with reference to FIGS. 32 to 34. It should be noted that in the fourth embodiment, the manufacturing steps carried out until the structure shown in FIG. 21 is obtained are the same as those in the second embodiment, and then the following steps are carried out. Also, it should be noted that the fourth embodiment will be explained by way of example by referring to the case where the oxide film 14-1 is not etched (that is, the oxide film 14-1 formed on the side surface of the semiconductor pillar 13 is used as the gate insulating film of each of the first to third SGTs).

Figure 32:
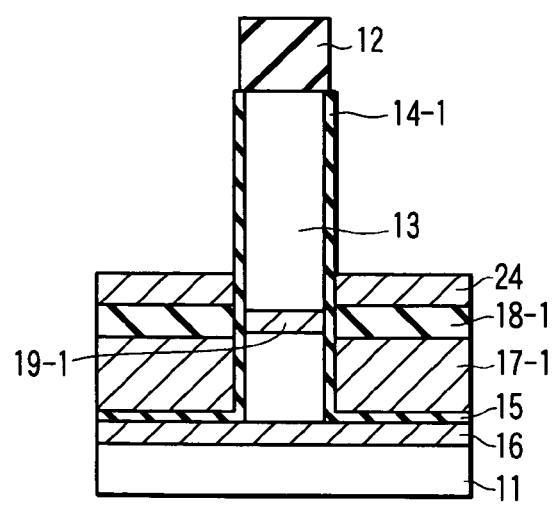
FIG. 32 is a vertical sectional view for use in explaining an example of a manufacturing method of a semiconductor device in a fourth embodiment of the present invention.
Figure 33:
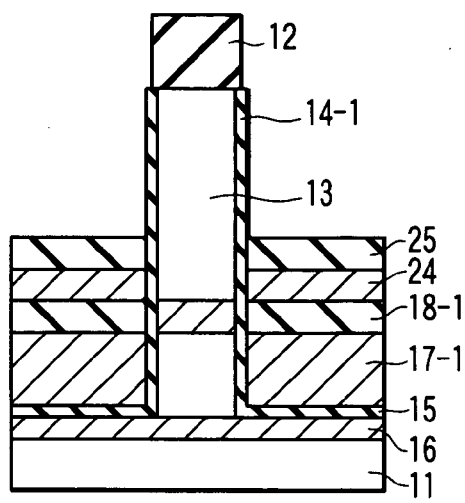
FIG. 33 is a vertical sectional view for use in explaining a step subsequent to a step in the manufacturing method which is to be explained with reference to FIG. 32.

In a step corresponding to FIG. 32, on the insulating layer 18-1, a metal layer (electrode) 24 is formed on the side surface of the semiconductor pillar 13. It should be noted that the layer of which the electrode 24 is formed is not limited to the metal layer. That is, the electrode 24 may be formed of a polysilicon layer. Then, as shown in FIG. 33, on the metal layer 24, an insulating layer 25 is formed on the side surface of the semiconductor pillar 13. The insulating layer 25 is formed of SiN, $SiO_2$, and TEOS, etc.

Figure 34:
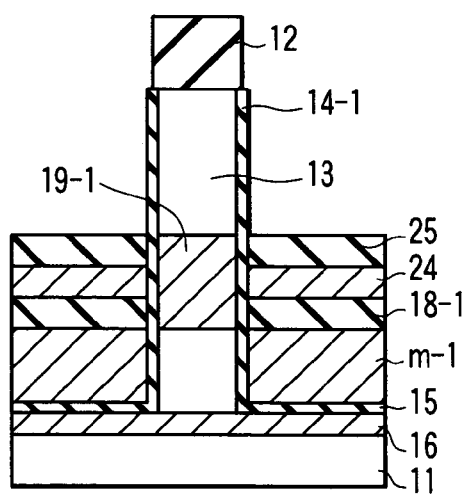
FIG. 34 is a vertical sectional view for use in explaining a step subsequent to the step in the manufacturing method which is to be explained with reference to FIG. 33.

Next, as shown in FIG. 34, $n^+$-type impurity ions of a high concentration are implanted into the insulating layer 25, and are diffused therefrom into the semiconductor pillar 13. Thereby, a source/drain region 19-1 is formed in part of the semiconductor pillar 13, which is located in a position corresponding to a side surface of the insulating layer 25. Then, annealing is performed to correct crystal defects, and electrically activate the implanted impurity ions.

It should be noted that as shown in FIG. 34, the source/drain region 19-1 is formed by combining a diffusion layer formed of the impurity ions implanted into the insulating layer 18-1 and a diffusion layer formed of the impurity ions implanted into the insulating layer 25. This can be achieved by adjusting the dosage of impurity to be ion-implanted and the acceleration voltage in the ion-implanting step. Also, to form the source/drain region 19, $n^+$-type impurity ions of a high concentration may be implanted into the metal layer 24.

Furthermore, the diffusion layer formed of the impurity ions implanted into the insulating layer 18-1 need not be continuous with the diffusion layer formed of the impurity ions implanted into the insulating layer 25. That is, it suffices that the diffusion layer formed of the impurity ions implanted into the insulating layer 18-1 and the diffusion layer formed of the impurity ions implanted into the insulating layer 25 are electrically connected to the metal layer 24.

In such a manner, a first SGT is formed to comprise the gate electrode 17-1, the gate insulating film 14-1, the source/drain regions 16 and 19-1 and the electrode 14. Thereafter, second and third SGTs are formed in the same manner as the first SGT.

In an S-SGT formed in the above manner, an electrode 24 can be provided which is electrically connected to the source/drain region formed in the semiconductor pillar. Further, the electrode 24 can be easily formed. In addition, it does not cause an increase in the place for providing the S-SGT. Therefore, according to the fourth embodiment also, an S-SGT can be more minutely formed.

Fifth Embodiment

The fifth embodiment will be explained by referring to an example of an S-SGT provided with an extension region. In the fifth embodiment, a source/drain region is formed to comprise two kinds of concentration regions, i.e., a low concentration region and a high concentration region. The low concentration region is provided close to a gate electrode (as an extension region).

An example of a method of manufacturing a semiconductor device according to the fifth embodiment of the present invention will be explained. It should be noted that in the fifth embodiment, the same manufacturing steps as in the second embodiment, explained with reference to FIGS. 1 to 17, are carried out, and then the following steps are carried out.

Figure 35:
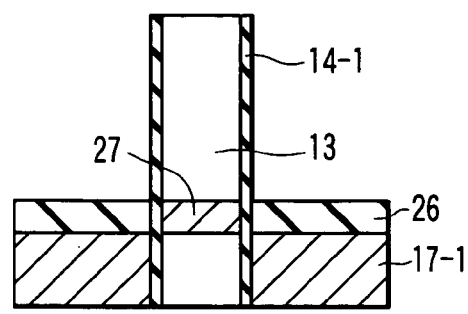
FIG. 35 is a vertical sectional view for use in explaining an example of a manufacturing method of a semiconductor device in a fifth embodiment of the present invention.

As shown in FIG. 35, on the gate electrode 17-1, an insulating layer 26 is formed on the side surface of the semiconductor pillar 13 (to be more specific, on the gate insulating film 14-1). Then, n$^-$-type impurity ions of a low concentration are implanted into the insulating layer 26, and are diffused therefrom into the semiconductor pillar 13. Thereby, an extension region 27 is formed in part of the semiconductor pillar 13, which is located in a position corresponding to that of a side surface of the insulating layer 26. The above ion implantation step is carried out such that the insulating layer 26 includes a portion whose impurity concentration is peak in the ion-implanted region.

Figure 36:
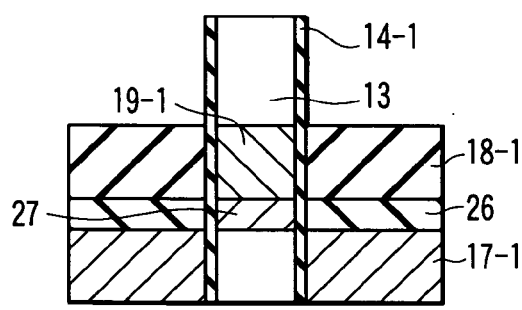
FIG. 36 is a vertical sectional view for use in explaining a step subsequent to a step in the manufacturing method which is to be explained with reference to FIG. 35.
Figure 37:
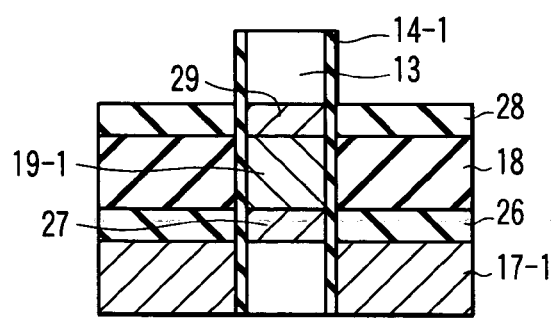
FIG. 37 is a vertical sectional view for use in explaining a step subsequent to the step in the manufacturing method which is to be explained with reference to FIG. 36.

Next, as shown in FIG. 36, on the insulating layer 26, an insulating layer 18-1 is formed on the side surface of the semiconductor pillar 13. Then, n$^+$-type impurity ions of a high concentration are implanted into the insulating layer 18-1, and are diffused therefrom into the semiconductor pillar 13. As a result, a source/drain region 19-1 is formed in part of the semiconductor pillar 13, which is located in a position corresponding to that of the insulating layer 18-1. Further, as shown in FIG. 37, on the insulating layer 18-1, an insulating layer 28 is formed on the side surface of the semiconductor pillar 13. Then, n$^-$-type impurity ions of a low concentration are implanted into the insulating layer 28, and are diffused from the insulating layer 28 into the semiconductor pillar 13. As a result, an extension region 29 is formed in part of the semiconductor pillar 13, which is located in a position corresponding to that of the insulating layer 28. This ion implantation step is also carried out such that the insulating layer 28 includes a portion whose impurity concentration is peak in the ion-implanted region. Then, annealing is performed to correct crystal defects, and electrically activate the implanted impurity ions.

In an S-SGT formed in the above manner, extension regions can be provided in parts of the semiconductor pillar 13, which are located in respective positions corresponding to the upper and lower surfaces of the gate electrode. Thereby, the channel electric field of the transistors can be reduced. Furthermore, due to provision of the extension regions, the short channel effect of the transistors can be restricted, and the current driving function can be improved.

Sixth Embodiment

In the sixth embodiment, an S-SGT is formed by using a substrate having an SOI (Silicon On Insulator) structure as a semiconductor substrate.

An example of a method of manufacturing a semiconductor device according to the sixth embodiment will be explained with reference to FIGS. 38 to 44.

Figure 38:
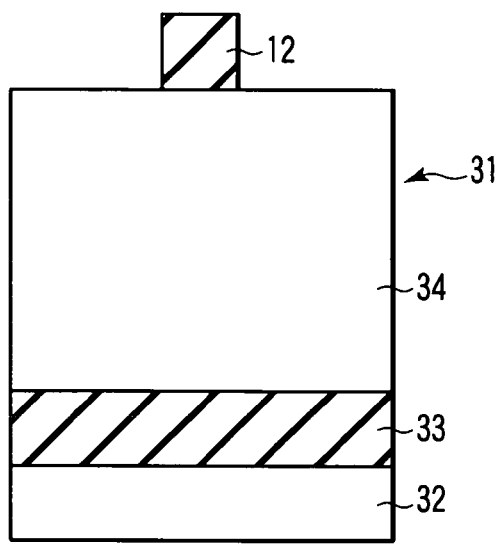
FIG. 38 is a vertical sectional view for use in explaining an example of a manufacturing method of a semiconductor device in a sixth embodiment of the present invention.

First, as shown in FIG. 38, an SOI substrate 31 having an SOI structure is prepared. The SOI substrate 31 comprises a support substrate 32, an insulating layer (e.g., a buried oxide (BOX) layer) 33 which is provided on the support substrate 32, and an SOI layer 34 which is provided on the BOX layer 33, and is a p-type semiconductor layer.

Figure 39:
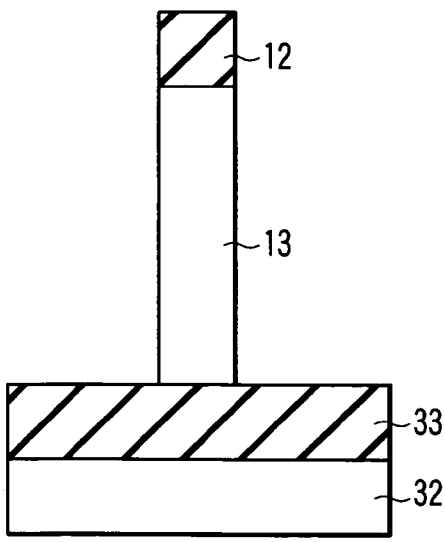
FIG. 39 is a vertical sectional view for use in explaining a step subsequent to a step in the manufacturing method which is to be explained with reference to FIG. 38.

Next, a mask layer 12 is formed on the SOI layer 34. Then, as shown in FIG. 39, the SOI layer 34 is etched to a depth corresponding to the surface of the BOX layer 33, by using, e.g., the RIE method, with the mask layer 12 used as a mask. As a result, a semiconductor pillar 13 and a groove are formed at the same time due to etching. Also, the BOX layer 33 serves as an element isolation region.

Figure 40:
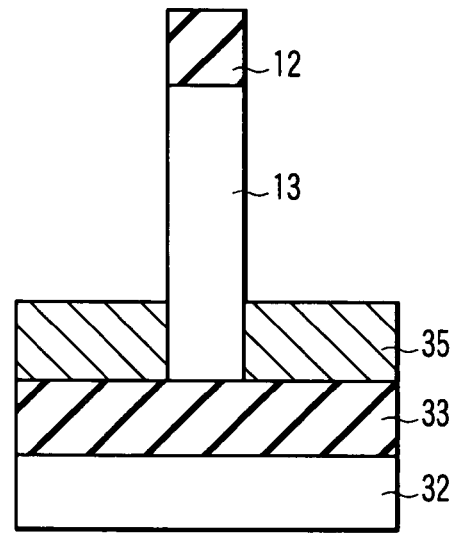
FIG. 40 is a vertical sectional view for use in explaining a step subsequent to the step in the manufacturing method which is to be explained with reference to FIG. 39.

Then, as shown in FIG. 40, on the BOX layer 33, polysilicon is deposited to cover the mask layer 12, and is then etched by the RIE method, thereby forming a conductive layer 35 having a desired height (thickness). The conductive layer 35 serves as an electrode which is to be electrically connected to a source/drain region 38 which will be described later.

Figure 41:
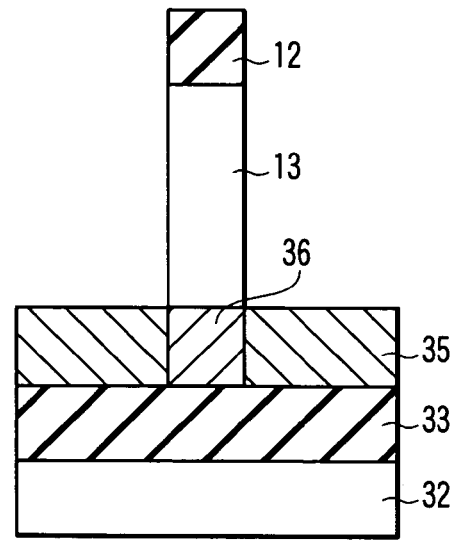
FIG. 41 is a vertical sectional view for use in explaining a step subsequent to the step in the manufacturing method which is to be explained with reference to FIG. 40.

Then, as shown in FIG. 41, n$^+$-type impurity ions of a high concentration are implanted into the conductive layer 35, and are diffused therefrom into the semiconductor pillar 13. Thereby, a diffusion layer 36 is formed in part of the semiconductor pillar 13, which is located in a position corresponding to that of a side surface of the conductive layer 35. This ion implantation step is carried out such that the conductive layer 35 includes a portion whose impurity concentration is peak in the ion-implanted region.

Figure 42:
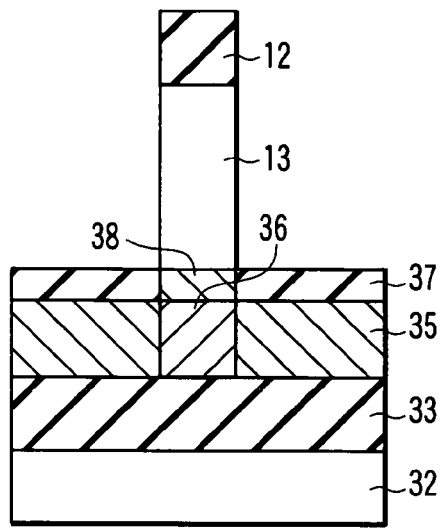
FIG. 42 is a vertical sectional view for use in explaining a step subsequent to the step in the manufacturing method which is to be explained with reference to FIG. 41.

Next, as shown in FIG. 42, on the conductive layer 35, an insulating layer 37 is deposited in such a manner as to cover the mask layer 12, and the insulating layer 37 is then etched by the RIE method to have a desired height (thickness). The insulating layer 37 is formed of SiN, SiO$_2$ and TEOS, etc.

Then, n$^+$-type impurity ions of a high concentration are implanted into the insulating layer 37, and are diffused therefrom into the semiconductor pillar 13. Thereby, a source/drain region 38 is formed in part of the semiconductor pillar 13, which is located in a position corresponding to that of a side surface of the conductive layer 35, such that it is electrically connected to the diffusion layer 36. This ion implantation step is carried out such that the insulating layer 37 includes a portion whose impurity concentration is peak in the ion-implanted region. Then, heat treatment (annealing) is performed to correct crystal defects, and electrically activate the implanted impurity ions.

Figure 43:
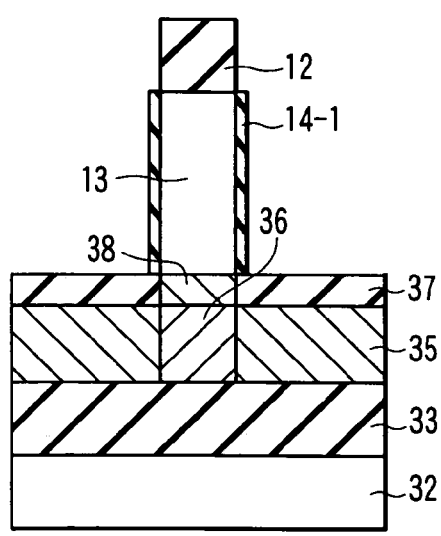
FIG. 43 is a vertical sectional view for use in explaining a step subsequent to the step in the manufacturing method which is to be explained with reference to FIG. 42.

Then, as shown in FIG. 43, SiO$_2$ is deposited on the side surface of the semiconductor pillar 13 by using the CVD method. Thereby, on the side surface of the semiconductor pillar 13, an oxide film (gate insulating film) 14-1 is formed on the insulating layer 37.

Figure 44:
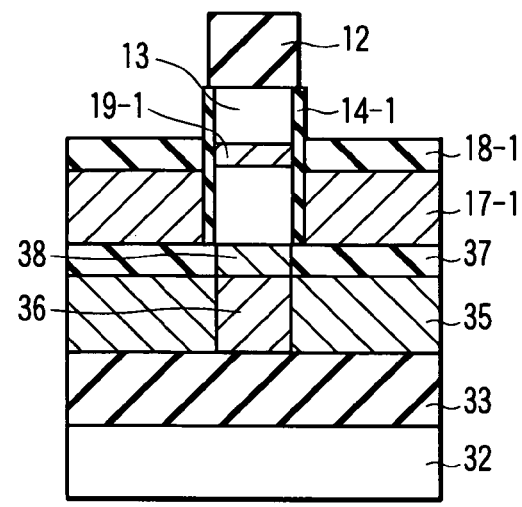
FIG. 44 is a vertical sectional view for use in explaining a step subsequent to the step in the manufacturing method which is to be explained with reference to FIG. 43.

Then, as shown in FIG. 44, a gate electrode 17-1, an insulating layer 18-1 and a source/drain region 19-1 are formed. In such a manner, a first SGT is formed which comprises the gate electrode 17-1, the gate insulating film 14-1 and the source/drain regions 19-1 and 38. Also, a number of SGTs are formed on the first SGT in the same manner as the first SGT, thereby forming an S-SGT.

As explained above, in the present invention, the SOI substrate can be used. The other advantages obtained in the sixth embodiment are the same as in the second embodiment. In addition, needless to say, the sixth embodiment can be applied to the other embodiments.

Seventh Embodiment

The seventh embodiment relates to a method for forming contact plugs at a plurality of gate electrodes which are included in an S-SGT.

Figure 26:
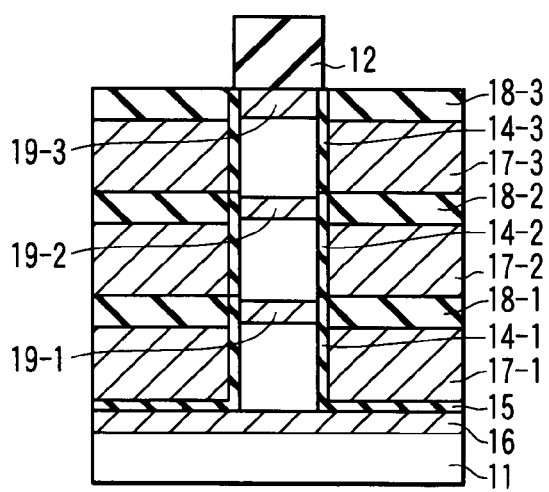
FIG. 26 is a vertical sectional view for use in explaining a step subsequent to the step in the manufacturing method which is to be explained with reference to FIG. 25.

An example of a method of manufacturing a semiconductor device according to the seventh embodiment will be explained with reference to FIGS. 45 to 49. In the seventh embodiment, the manufacturing steps carried out until an S-SGT, as shown in FIG. 26, is formed are the same those in the second embodiment, and then the following steps are carried out. It should be noted that the seventh embodiment will be explained by referring to, by way of example, the case where a gate electrode having a circular plan configuration.

Figure 45:
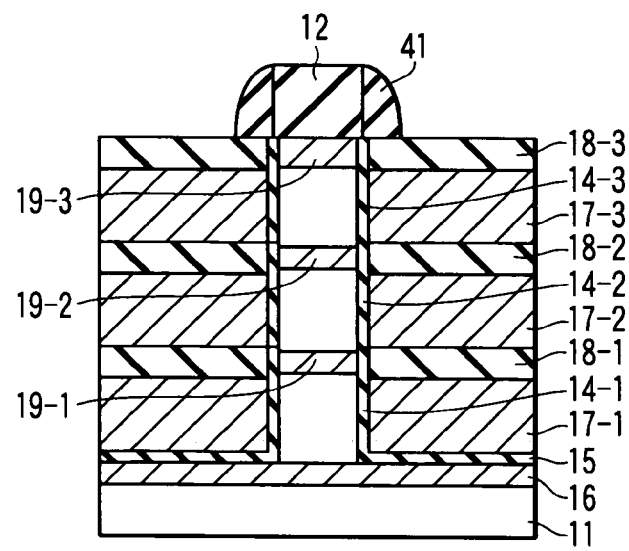
FIG. 45 is a vertical sectional view for use in explaining an example of a manufacturing method of a semiconductor device in a seventh embodiment of the present invention.

In a step corresponding to FIG. 45, on an insulating layer 18-3, a side wall insulating film 41 is formed on the side surface of the mask layer 12. Then, as shown in FIG. 46, the insulating layer 18-3 and the gate electrode 17-3 are anisotropically etched by the RIE method, with the side wall insulating film 41 used as a mask.

Next, as shown in FIG. 47, on the insulating layer 18-2, a side wall insulating film 42 is formed on a side surface of the side wall insulating film 41. Then, the insulating layer 18-2 and the gate electrode 17-2 are anisotropically etched by the RIE method, with the side wall insulating film 42 used as a mask.

Then, on the insulating layer 18-1, a side wall insulating film 43 is formed on a side surface of the side wall insulating film 42. Then, the insulating layer 18-1 and the gate electrode 17-1 are anisotropically etched by the RIE method, with the side wall insulating film 43 used as a mask. As a result, the gate electrodes 17-1, 17-2 and 17-3 are arranged in order of diameter to form a tiered structure.

Figure 48:
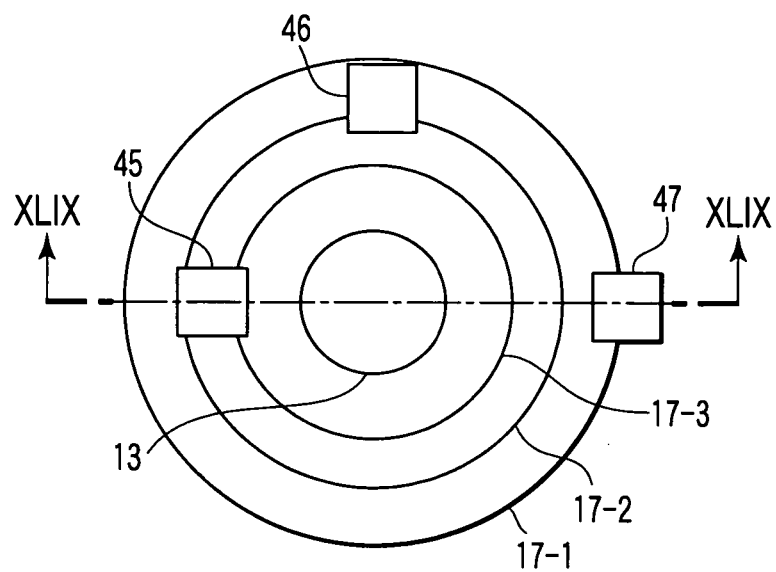
FIG. 48 is a plan view showing the layout of contact plugs 45, 46 and 47 in the seventh embodiment of the present invention.
Figure 49:
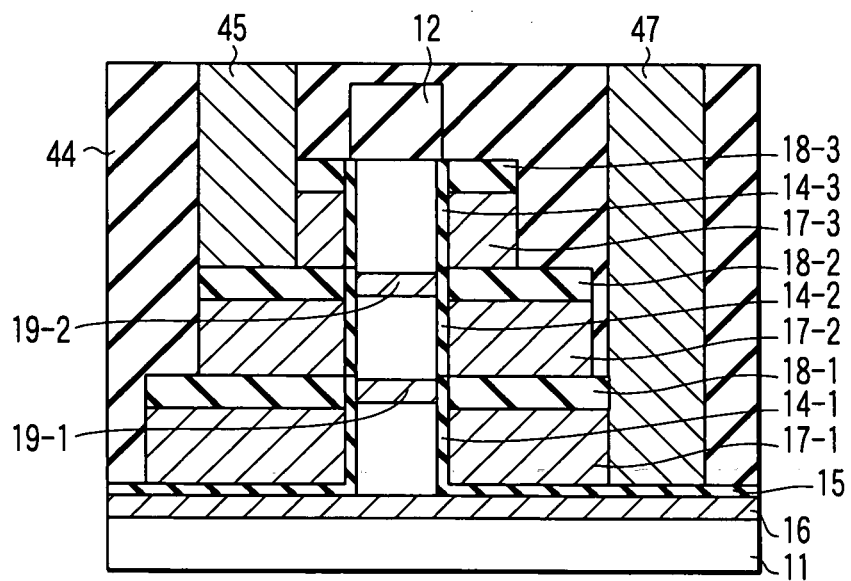
FIG. 49 is a vertical sectional view taken along line XLIX—XLIX in FIG. 48.

Thereafter, contact plugs 45, 46 and 47 to be connected to the gate electrodes 17-1, 17-2 and 17-3 are formed in the following manner. FIG. 48 is a plan view showing the layout of the contact plugs 45, 46 and 47. FIG. 49 is a vertical sectional view taken along line XLIX—XLIX in FIG. 48.

First, a contact hole (opening) is formed in an interlayer insulating film 44 and the insulating layer 18-3 in such a manner as to expose part of the gate electrode 17-3. Similarly, two contact holes (openings) are formed to expose respective parts of the gate electrodes 17-1 and 17-2. Those contact holes are displaced from each other with respect to a center portion (semiconductor pillar 13) which is located in the center of the resultant structure as shown in a plan view, e.g., FIG. 50, such that they do not overlap each other. Then, the contact holes are filled with conductors (e.g., metal), thereby forming contact plugs 45, 46 and 47.

In the S-SGT of the present invention, a plurality of gate electrodes having the same plan configuration are stacked together. Thereby, as mentioned above, the gate electrodes can be etched to have an arbitrary shape. Therefore, contact plugs can be formed vertically and in their arbitrary positions, such that they are electrically connected to the gate electrodes. Further, it is not necessary to form insulating films on side surfaces of the contact holes.

Furthermore, when each of the contact plugs is formed, a positioning margin is allowed. Therefore, the contact plugs are not required to be formed with a high accuracy.

Eighth Embodiment

Figure 50:
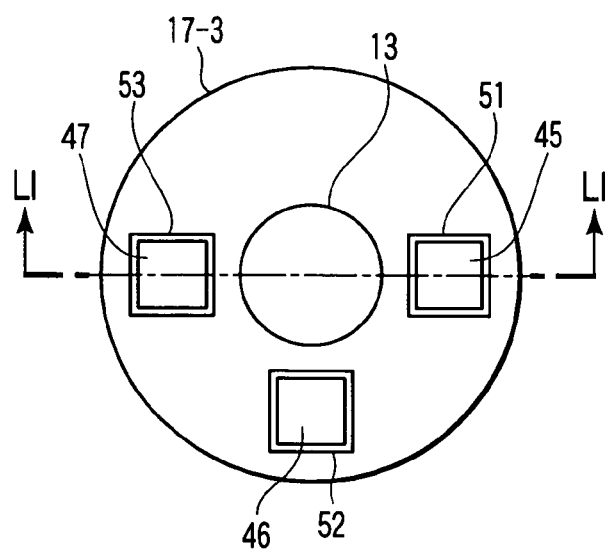
FIG. 50 is a plan view showing the layout of contact plugs 45, 46 and 47 in an eighth embodiment of the present invention.

The eighth embodiment relates to another method for forming contact plugs. An example of a method of manufacturing a semiconductor device according to the eighth embodiment will be explained with reference to FIGS. 50 to 53. FIG. 50 is a plan view showing the layout of the contact plugs 45, 46 and 47.

In the eighth embodiment also, the manufacturing steps carried out until the S-SGT is formed as shown in FIG. 26 is formed are the same as those in the second embodiment, and then the following steps are carried out. It should be noted that the eighth embodiment will be explained by referring to, by way of example, the case where the cross sections of the gate electrodes are circular.

Figure 51:
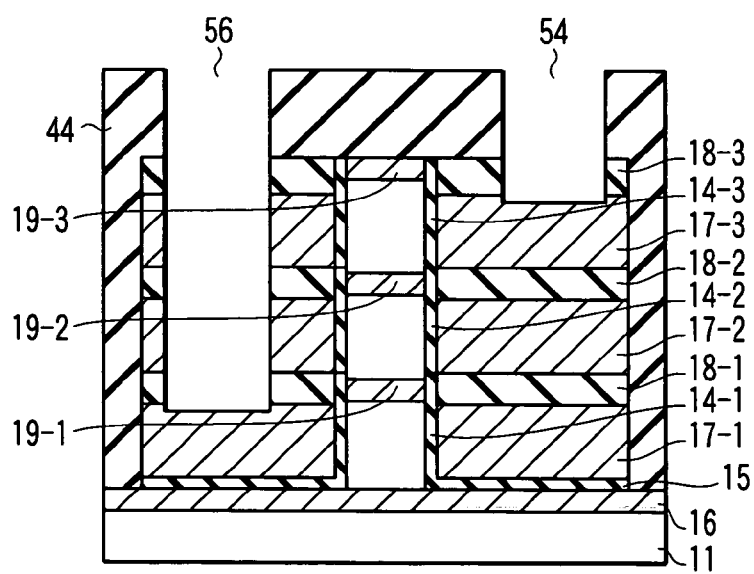
FIG. 51 is a vertical sectional view for use in explaining an example of a manufacturing method of a semiconductor device in the eighth embodiment of the present invention.

In a step corresponding to FIG. 51 (vertical sectional view taken along line LI—LI in FIG. 50), contact holes 54, 55 and 56 are formed in the interlayer insulating films, the insulating films and the gate electrodes to expose respective parts of the gate electrodes 17-3, 17-2 and 17-1. The contact holes 54, 55 and 56 are concentrically formed with respect to the center of the semiconductor pillar 13.

Figure 52:
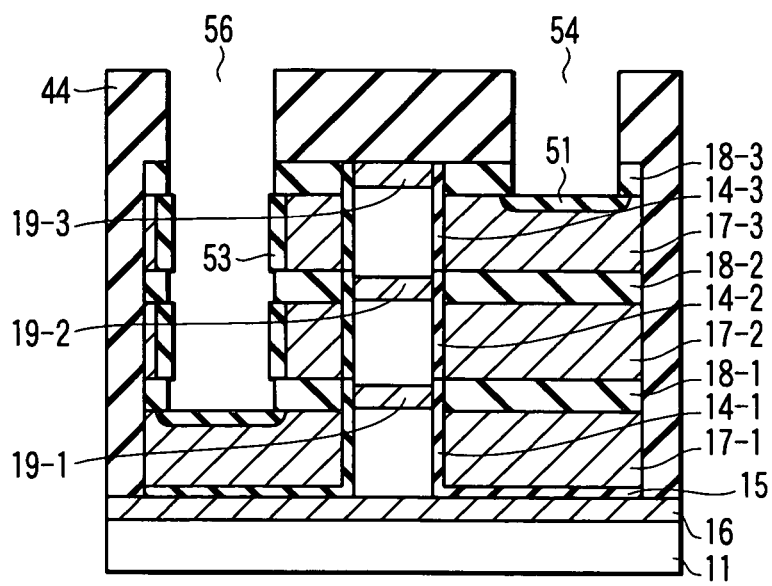
FIG. 52 is a vertical sectional view for use in explaining a step subsequent to a step in the manufacturing method which is to be explained with reference to FIG. 51.

Next, as shown in FIG. 52, the gate electrodes 17-3, 17-2 and 17-1 are thermally oxidized, thereby forming oxide films 51, 52 and 53 on side surface of the contact holes 54, 55 and 56. The oxide films 51, 52 and 53 may be formed by depositing $SiO_2$ on the side surfaces of the contact holes 54, 55 and 56.

Figure 53:
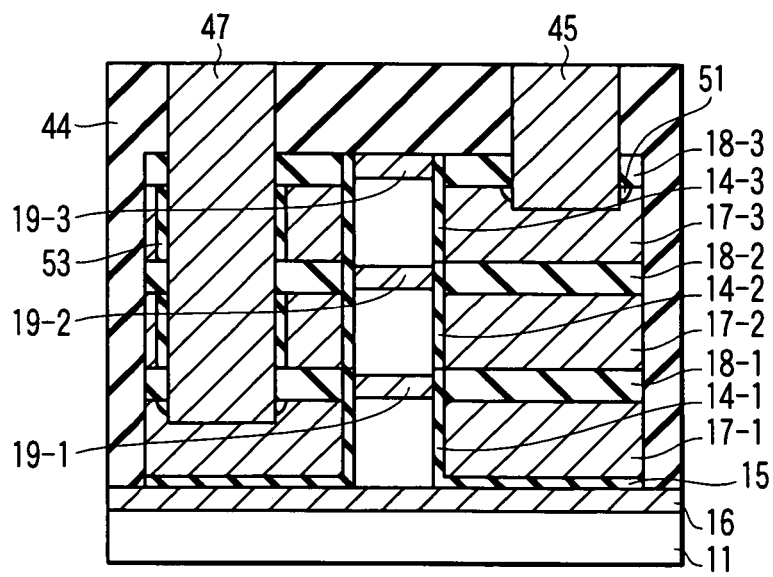
FIG. 53 is a vertical sectional view for use in explaining a step subsequent to the step in the manufacturing method which is to be explained with reference to FIG. 52.

Then, as shown in FIG. 53, parts of the oxide films 51, 52 and 53 which are located in contact plug formation regions are etched by using the RIE method. Then, the contact holes 54, 55 and 56 are filled with, e.g., metal, thereby forming contact plugs 45, 46 and 47.

As explained above, according to the eighth embodiment, contact plugs can be formed in arbitrary positions. That is, in formation of each of the contact plugs, a positioning margin is allowed. Thus, they are not required to be formed with a high accuracy.

Furthermore, the gate electrodes do not need to be processed in shape in order that the contact plugs be electrically connected to the gate electrodes. Thus, the number of steps for forming the contact plugs can be decreased.

Ninth Embodiment

Figure 54:
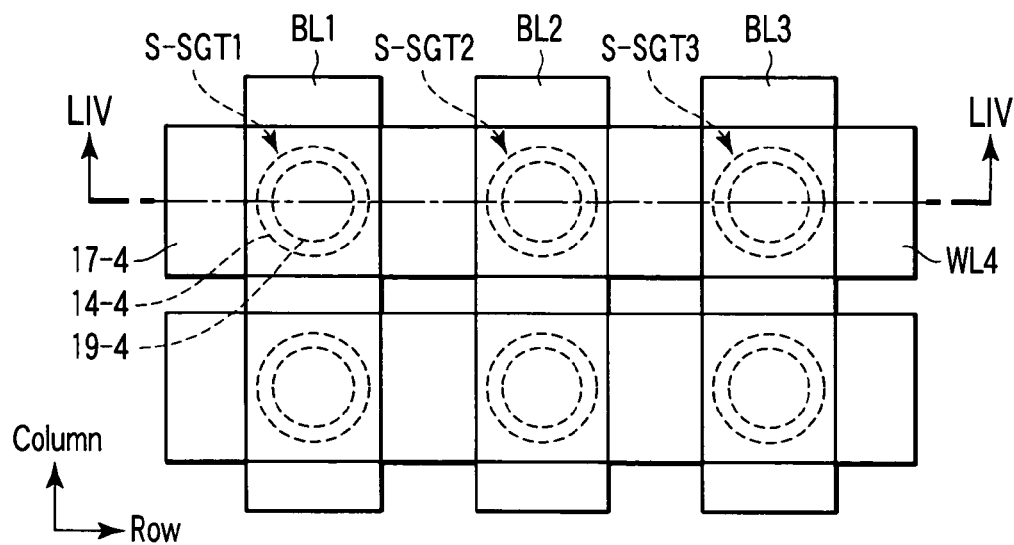
FIG. 54 is a plan view showing the layout of a NAND circuit in a ninth embodiment present invention.
Figure 55:
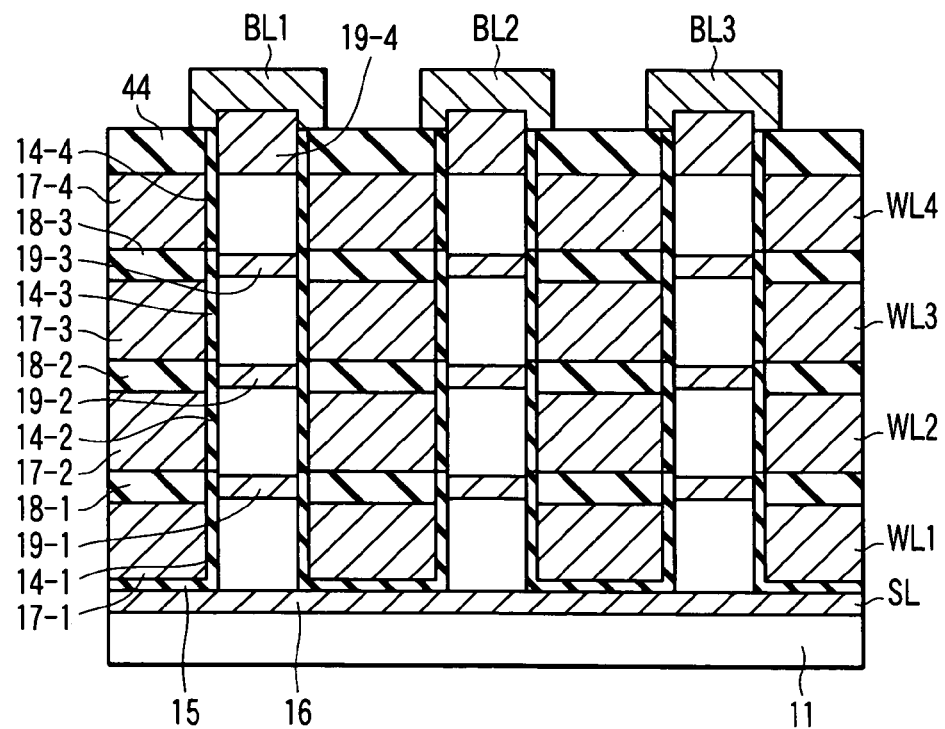
FIG. 55 is a vertical sectional view taken along line LIV—LIV in FIG. 54.

The ninth embodiment relates to the structure of a NAND circuit including an S-SGT. FIG. 54 is a plan view showing the layout of a NAND circuit according to a NAND circuit according to the ninth embodiment. FIG. 55 is a vertical sectional view taken along line LIV—LIV in FIG. 54.

In the ninth embodiment, a number of S-SGTs are formed, and each of them comprises, e.g., four SGTs 1 to 4. The structures of the SGTs 1 to 3 are the same as those in the second embodiment. In order to form each S-SGT, the following steps are carried out.

After formation of the SGTs 1 to 3, a gate insulating film 14-4 and a gate electrode 17-4 are formed on the insulating film 18-3 and the side surface of the semiconductor pillar 13.

Next, on the gate insulating film 14-4 and the gate electrode 17-4, an interlayer insulating film 44 is formed on the side surface of the semiconductor pillar 13 such that its upper surface is coincident in level with the upper surface of the semiconductor pillar 13. Then, $n^+$-type impurity ions of a high concentration are implanted into the interlayer insulating film 44, and are diffused therefrom into the semiconductor pillar 13. Thereby, a source/drain region 19-4 is formed in upper part of the semiconductor pillar 13, which is located in a position corresponding to that of a side surface of the interlayer insulating film 44. This ion implantation is carried out such that the interlayer insulating film 44 includes a portion whose impurity concentration is peak in the ion-implanted region. Thereafter, heat treatment (annealing) is carried out in order to correct crystal defects, and electrically activate the implanted impurity ions.

Then, part of the interlayer insulating film 44 is etched by the RIE method such that upper part of the source/drain region 19-4 is exposed from the interlayer insulating film 44. Then, a metal layer (BL) is formed as a bit line BL on the interlayer insulating film 44 such that it is electrically connected to the source/drain region 19-4. The bit line BL extends in a column direction.

As shown in FIG. 54, S-SGTs 1 to 3 each formed in the above manner are arranged adjacent to each other in a row direction. The S-SGT1 to S-SGT3 share the gate electrodes 17-1, 17-2, 17-3 and 17-4.

The gate electrodes 17-1, 17-2, 17-3 and 17-4 serve as word lines WL1, WL2, WL3 and WL4, which extend in the row direction. The source/drain region 16 serves as a source line SL to which a power supply voltage is to be supplied.

Figure 56:
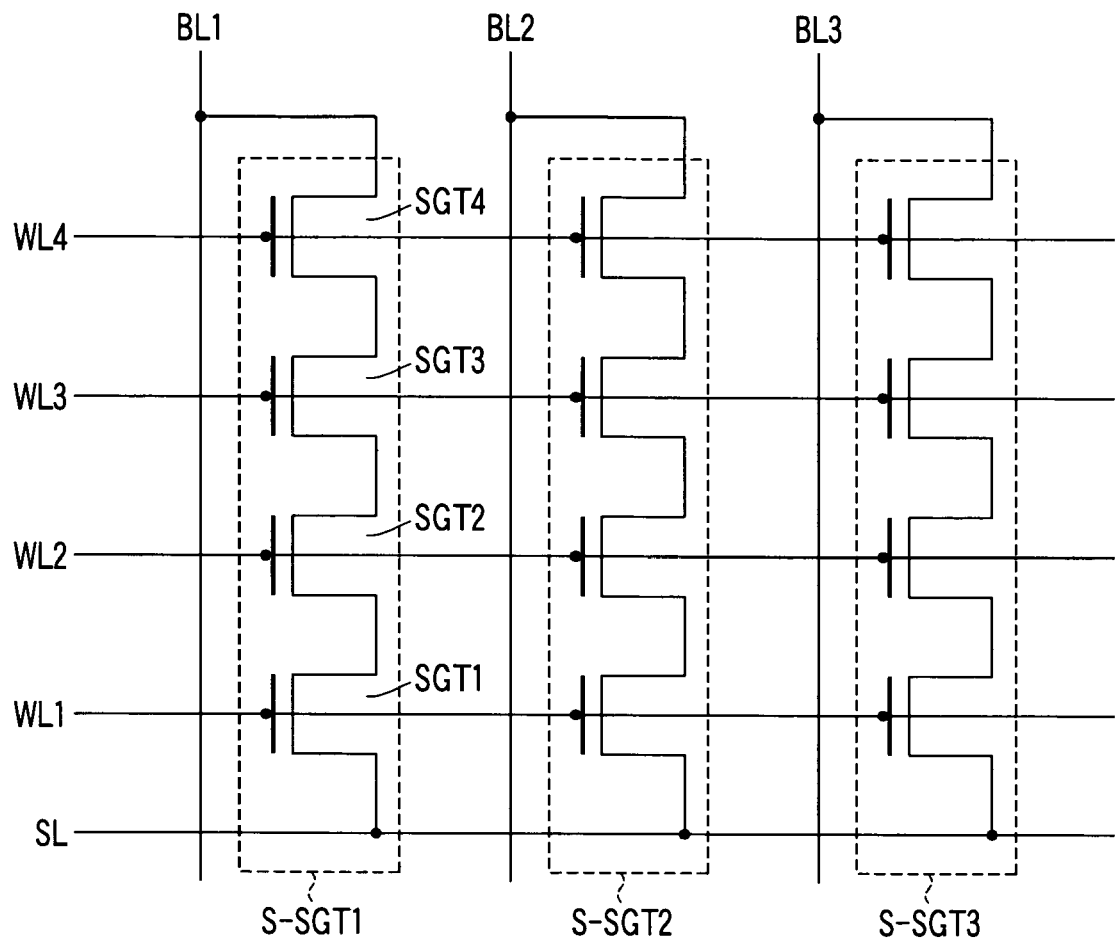
FIG. 56 is a circuit diagram of the NAND circuit shown in FIGS. 54 and 55.

FIG. 56 is a circuit diagram of the NAND circuit shown in FIG. 55. In the S-SGT1, the gate electrode of the SGT1 is connected to the word line WL1. One of the source/drain regions of the SGT1 is connected to the source line SL, and the other is connected to one of the source/drain regions of the SGT2.

The gate electrode of the SGT2 is connected to the word line WL2. The above other source/drain region of the SGT2 is connected to one of the source/drain regions of the SGT3. The gate electrode of the SGT3 is connected to the word line WL3. The other source/drain region of the SGT3 is connected to one of the source/drain regions of the SGT4. The gate electrode of the SGT4 is connected to the word line WL4. The other source/drain region of the SGT4 is connected to the bit line BL1. The same is true of the S-SGT2 and S-SGT3 respectively connected to the bit lines BL2 and BL3.

The S-SGT1 formed in the above manner functions as a NAND circuit including four input terminals. The same is true of the other S-SGTs. Therefore, the place for providing NAND circuits is small.

The above explanation of the ninth embodiment is given by referring to the case where each of S-SGTs comprises four SGTs. However, needless to say, the number of SGTs in each S-SGT can be arbitrarily determined.

Tenth Embodiment

In the tenth embodiment, a flash memory is formed by using the manufacturing method of the present invention. An example of a method of manufacturing a semiconductor device according to the tenth embodiment will be explained with reference to FIGS. 57 to 64.

Figure 57:
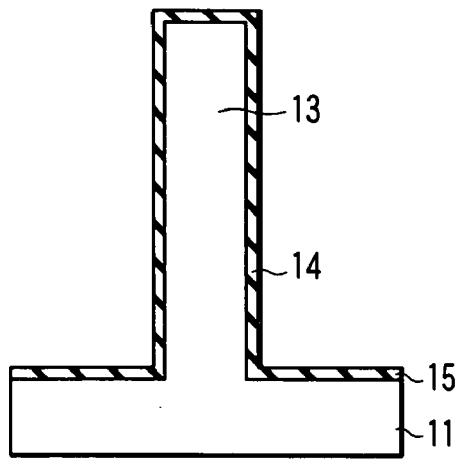
FIG. 57 is a vertical sectional view for use in explaining an example of a manufacturing method of a semiconductor device in a tenth embodiment of the present invention.

First, a semiconductor pillar 13 is formed on the surface of a semiconductor substrate 11. Then, a mask layer 12 (not shown) on the semiconductor pillar 13 is etched. Further, as shown in FIG. 57, the semiconductor substrate 11 and the semiconductor pillar 13 are thermally oxidized. As a result, an oxide film 14 is formed on the upper and side surfaces of the semiconductor pillar 13, and an oxide film 15 is formed on the upper surface of the semiconductor substrate 11. The oxide film 14 will become a gate insulating film later.

Figure 58:
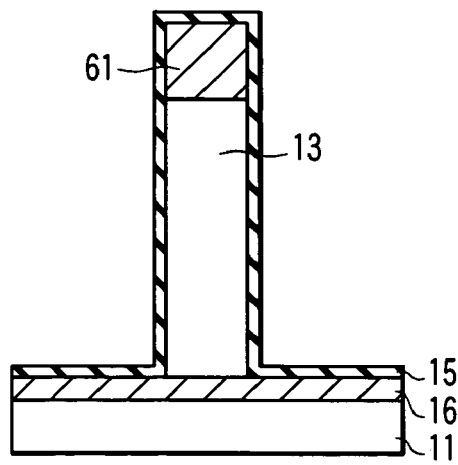
FIG. 58 is a vertical sectional view for use in explaining a step subsequent to the step in the manufacturing method which is to be explained with reference to FIG. 57.

Next, as shown in FIG. 58, $n^+$-type impurity ions (e.g., arsenic) of a high concentration are implanted into the semiconductor substrate 11 and the semiconductor pillar 13, as a result of which a source/drain region 16 is formed in a surface portion of the semiconductor substrate 11, and a source/drain region 61 is formed in an upper portion of the semiconductor pillar 13. This ion implantation is applied in a direction perpendicular to the semiconductor substrate 11. Thereafter, heat treatment (annealing) is carried out to correct crystal defects, and electrically activate the implanted impurity ions.

In the tenth embodiment, the source/drain region 61 is formed in the upper portion of the semiconductor pillar 13 at the same time as in the step of forming the source/drain region 16. However, the source/drain region 61 in the upper portion of the semiconductor pillar 13 may be formed at the time of forming the uppermost one of the SGTs.

Figure 59:
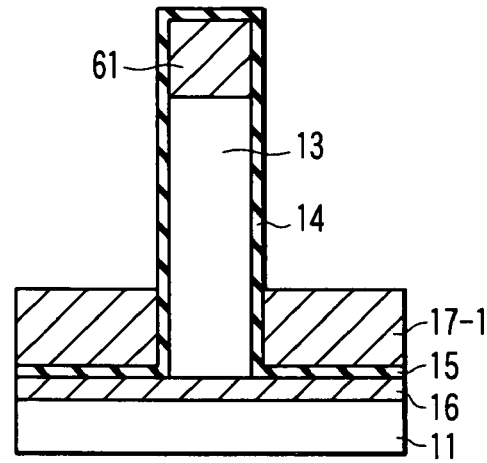
FIG. 59 is a vertical sectional view for use in explaining a step subsequent to the step in the manufacturing method which is to be explained with reference to FIG. 58.

Next, on the semiconductor substrate 11, polysilicon is deposited as a polysilicon layer 17-1 by using, e.g., the CVD method, in such a manner as to cover the semiconductor pillar 13, and then the surface of the polysilicon layer 17-1 is flattened by the CMP method. Then, as shown in FIG. 59, the polysilicon layer 17-1 is etched to have a desired height by the RIE method.

Figure 60:
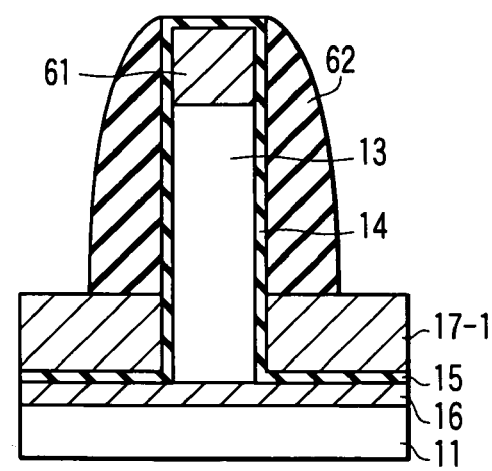
FIG. 60 is a vertical sectional view for use in explaining a step subsequent to the step in the manufacturing method which is to be explained with reference to FIG. 59.

Then, as shown in FIG. 60, a side wall insulating film 62 (e.g., SiN) is formed on the side surface of the semiconductor pillar 13 (to be more specific, it is formed on the side surface of the gate insulating film 14). Further, as shown in FIG. 61, the polysilicon layer 17-1 is anisotropically etched to a depth corresponding to the upper surface of the oxide film 15, with the side wall insulating film 62 used as a mask. As a result, the polyslicon layer 17-1 functions as a floating gate electrode (charge-storage layer) to be included in a flash memory cell.

Then, as shown in FIG. 62, the side surface of the polysilicon layer 17-1 is oxidized, thereby forming a gate-to-gate insulating film 63-1 on the side surface of the polysilicon layer 17-1. It should be noted that the gate-to-gate insulating film 63-1 may be formed by depositing $SiO_2$ on the side surface of the polysilicon layer 17-1.

Figure 63:
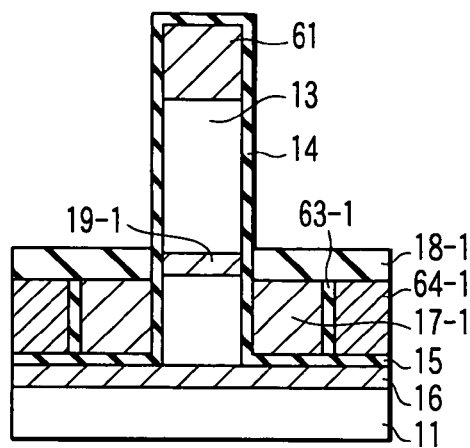
FIG. 63 is a vertical sectional view for use in explaining a step subsequent to the step in the manufacturing method which is to be explained with reference to FIG. 62.

Then, as shown in FIG. 63, on the oxide film 15, a polysilicon layer 64-1 is formed on the side surface of the gate-to-gate insulating film 63-1. The polysilicon layer 64-1 functions as a control gate electrode (word line WL) to be included in the flash memory.

Then, an insulating layer 18-1 is formed on the polysilicon layer 17-1 and the polysilicon layer 64-1. Further, $n^+$-type impurity ions of a high concentration are implanted into the insulating layer 18-1, and are diffused therefrom into the semiconductor pillar 13. Thereby, a source/drain region 19-1 is formed in part of the semiconductor pillar 13, which is located in a position corresponding to that of the insulating layer 18-1. Then, heat treatment (annealing) is carried out to correct crystal defects, and electrically activate the implanted impurity ions. Thereafter, on an SGT2 formed in the above manner, an SGT2 is formed in the same manner as the SGT1.

Figure 64:
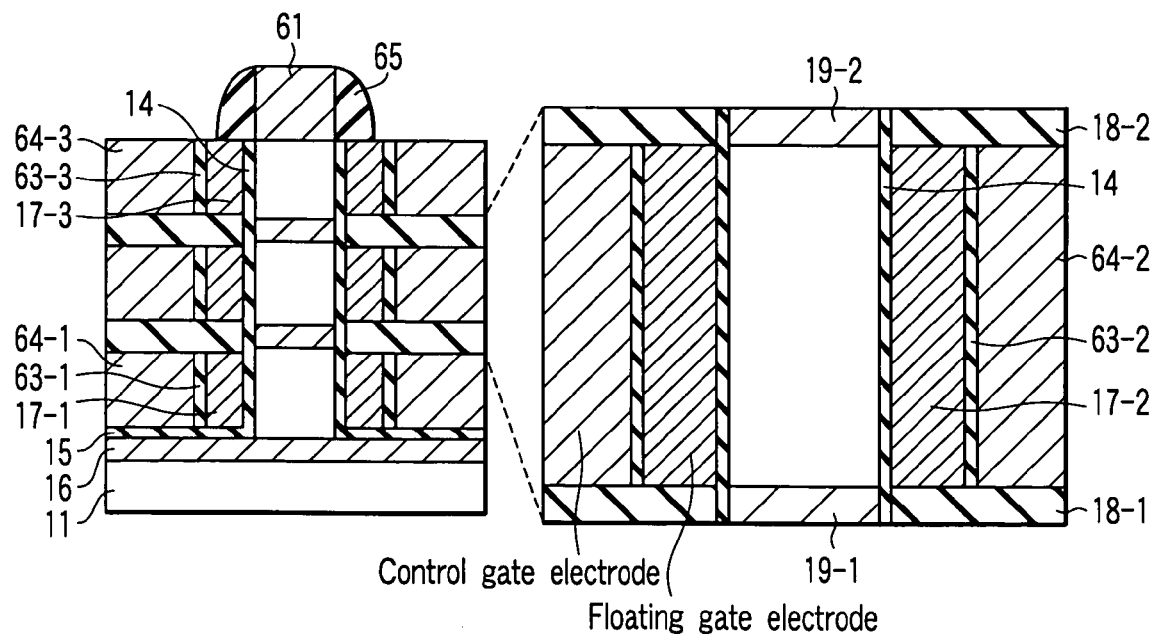
FIG. 64 is a vertical sectional view for use in explaining a step subsequent to the step in the manufacturing method which is to be explained with reference to FIG. 63.

Next, as shown in FIG. 64, a polysilicon layer 17-3 having a desired height is formed. Further, a side wall insulating film 65 (e.g., SiN) is formed on the side surface of the semiconductor pillar 13. Then, the polysilicon layer 17-3 is anisotropically etched to a depth corresponding to the upper surface of the insulating layer 18-2, with the side wall insulating film 65 used as a mask. Thereafter, a gate-to-gate insulating film 63-3 and a polysilicon layer 64-3 are formed. Consequently an SGT3 is formed which comprises the polyslicon layers 17-3 and 64-3, the gate insulating film 14, the gate-to-gate insulating film 63-3 and the source/drain regions 19-2 and 61.

As a result of formation of the SGTs in the above manner, flash memory cells are formed. Further, according to the tenth embodiment, the place for providing the flash memory cells is small. Accordingly, a flash memory can be more minutely formed, and its structural elements can be arranged at a higher density.

Figure 65:
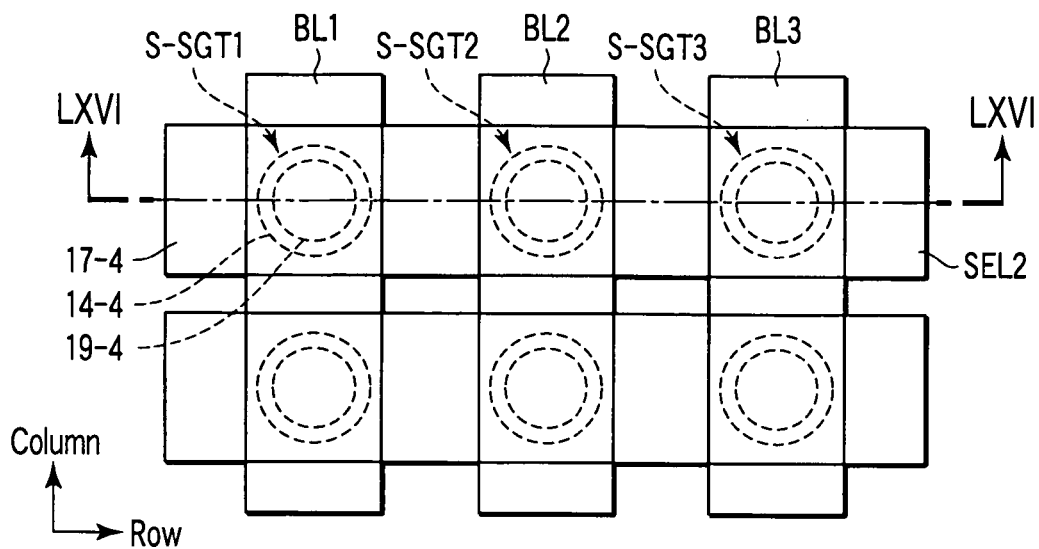
FIG. 65 is a plan view showing the layout and structure of a NAND type flash memory.
Figure 66:
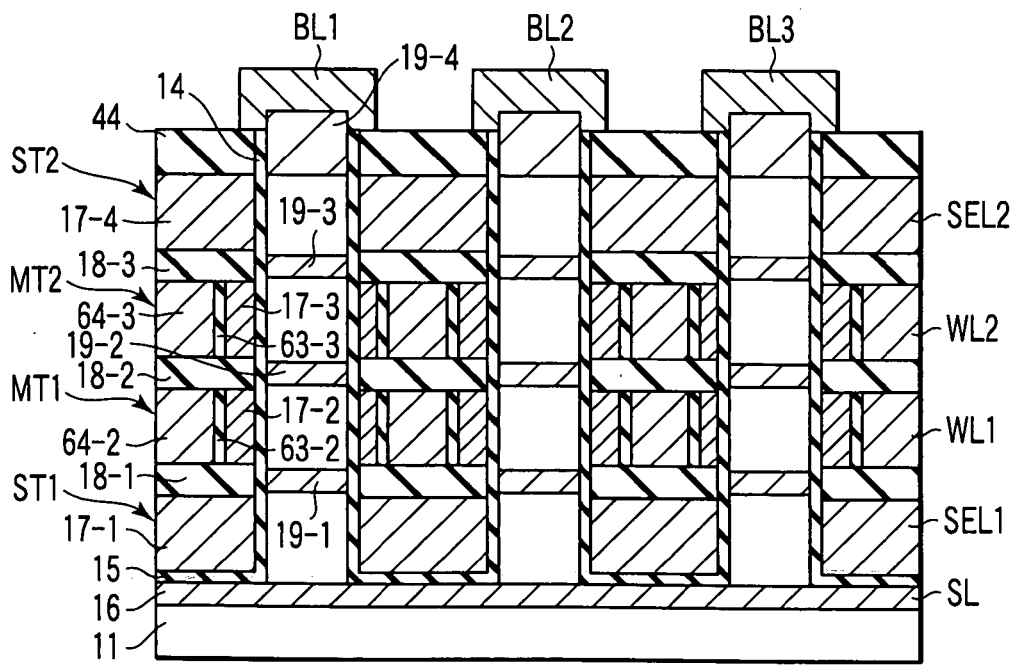
FIG. 66 is a vertical sectional view taken along line LXVI—LXVI in FIG. 65.

Furthermore, a NAND type flash memory can be formed of flash memory cells formed in the above manner. FIG. 65 is a plan view showing the layout of the NAND type flash memory. FIG. 66 is a vertical sectional view taken along line LXVI—LXVI in FIG. 65.

Each S-SGT is formed such that a selection transistor ST1, two flash memory cell transistors MT1 and MT2 and a selection transistor ST2 are successively stacked in this order. The selection transistor ST1 and ST2 are manufactured by the method according to, e.g., the second embodiment. The flash memory cell transistors MT1 and MT2 are manufactured in the same manner as in the above flash memory cells.

The selection transistor ST1 comprises the gate electrode 17-1, which functions as a first selection line SEL1. The memory cell transistor MT1 comprises a control gate electrode 64-2, which functions as a word line WL1. The memory cell transistor ST2 comprises a gate electrode 17-4, which functions as a second selection line SEL2.

FIG. 67 is a circuit diagram of the NAND type flash memory shown in FIG. 66. The NAND type flash memory comprises three blocks BLK1 to BLK3. In each of the blocks BLK1 to BLK3, the selection transistor ST1, the two flash memory cell transistors MT1 and MT2 and the selection transistor ST2 are connected in series in this order.

To be more specific, the gate electrode of the selection transistor ST1 is connected to the first selection line SELL. One of the source/drain regions of the selection transistor ST1 is connected to the source line SL, and the other is connected to one of the source/drain regions of the memory cell transistor MT1.

The control gate electrode of the memory cell transistor MT1 is connected to the word line WL1. The other source/drain region of the memory cell transistor MT1 is connected to one of the source/drain regions of the memory cell transistor MT2. The control gate electrode of the memory cell transistor MT2 is connected to the word line WL2. The other source/drain region of the memory cell transistor MT2 is connected to one of the source/drain regions of the selection transistor ST2.

The gate electrode of the selection transistor ST2 is connected to the second selection line SEL2. The other source/drain region of the selection transistor ST2 is connected to the bit line BL1. The blocks BLK2 and BLK3 respectively connected to bit lines BL2 and BL3 have the same structure as the block BLK1.

In such a manner, a NAND type flash memory can be formed by applying the present invention. In addition, the place for providing the NDND type flash memory is small.

Furthermore, according to the present invention, a flash memory can be formed of a flash memory cell MC comprising a memory cell transistor MT and a selection transistor ST. FIG. 68 is a vertical sectional view showing the structure of the flash memory.

In the flash memory, the selection transistor ST is formed above the semiconductor substrate 11. The memory cell transistor MT is formed above the selection transistor ST. The selection transistor ST and the memory cell transistor MT are connected in series. The selection transistor ST and the memory cell transistor MT are manufactured as explained above.

In such a manner, according to the present invention, a flash memory can be formed which comprises one flash memory cell MC comprising a memory cell transistor MT and a selection transistor ST.

FIG. 68 shows one memory cell. However, a number of memory cells may be formed such that they are stacked together. In addition, two selection transistors may be provided and connected in series with a number of memory cells, such that the memory cells are located between the selection transistors (see FIG. 66).

The method of manufacturing the semiconductor device and the semiconductor device, both disclosed in the "BRIEF SUMMARY OF THE INVENTION" section, can be provided to satisfy the following:

(1) The method of manufacturing the semiconductor device, according to the above first aspect, further comprises thermally treating on the first insulating layer and the semiconductor pillar to diffuse the impurity, after the forming the second source/drain region.

(2) In the method of manufacturing the semiconductor device, according to the first aspect, the doping the impurity includes implanting ions of the impurity.

(3) The method of manufacturing the semiconductor device, according to the first aspect, further comprises, after the forming the second source/drain region, forming an opening in the first insulating layer to expose part of the gate electrode, and embedding a conductor in the opening, thereby forming a contact plug which is electrically connected to the gate electrode.

(4) In the method of manufacturing the semiconductor device, according to the above second aspect, a peak impurity concentration of the first source/drain region is substantially equal to that of the first insulating layer, and a peak impurity concentration of the second source/drain region is substantially equal to that of the second insulating layer.

(5) In the method of manufacturing the semiconductor device, according to the second aspect, a level at which the first source/drain region has a peak impurity concentration is substantially identical to a level at which the first insulating layer has a peak impurity concentration, and a level at which the second source/drain region has a peak impurity concentration is substantially identical to a level at which the second insulating layer has a peak impurity concentration.

(6) In the method of manufacturing the semiconductor device, according to the second aspect, the forming the first source/drain region further comprises, after the doping the impurity into the first insulating layer, forming a first conductive layer as an electrode, which contacts a side surface of the semiconductor pillar, and surrounds the semiconductor pillar, forming a fifth insulating layer on the first conductive layer, which contacts a side surface of the semiconductor pillar, and surrounds the semiconductor pillar, and doping the impurity into the fifth insulating layer.

(7) In the method of manufacturing the semiconductor device, according to the second aspect, the forming the second source/drain region further comprises, after the doping the impurity into the second insulating layer, forming a second conductive layer as an electrode, which contacts a side surface of the semiconductor pillar, and surrounds the semiconductor pillar, forming a sixth insulating layer on the second conductive layer, which contacts a side surface of the semiconductor pillar, and surrounds the semiconductor pillar, and doping the impurity into the sixth insulating layer.

(8) The method of manufacturing the semiconductor device, according to the second aspect, further comprises doping the impurity into the semiconductor substrate, thereby forming a third source/drain region in part of the semiconductor substrate, which is located under the semiconductor pillar, after the forming the semiconductor pillar.

(9) In the method of manufacturing the semiconductor device, according to the second aspect, the first and second insulating layers are used as interlayer insulating films.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a mask layer on a semiconductor substrate;
    etching the semiconductor substrate using the mask layer as a mask, thereby forming a semiconductor pillar;
    doping an impurity into the semiconductor substrate, thereby forming a first source/drain region in part of the semiconductor substrate, which is located under the semiconductor pillar;
    forming a gate insulating film on the semiconductor substrate, which contacts a side surface of the semiconductor pillar, and surrounds the semiconductor pillar;
    forming a gate electrode on a side surface of the gate insulating film;
    forming a first insulating layer on the gate electrode, which contacts a side surface of the semiconductor pillar, and surrounds the semiconductor pillar; and
    doping the impurity into the first insulating layer, thereby forming a second source/drain region in part of the semiconductor pillar, which is located on a side surface of the first insulating layer.

2. The method according to claim 1, wherein a peak impurity concentration of the second source/drain region is substantially equal to that of the first insulating layer.

3. The method according to claim 1, wherein a level at which the second source/drain region has a peak impurity concentration is substantially identical to a level at which the first insulating layer has a peak impurity concentration.

4. The method according to claim 1, which further comprises:
    forming a second insulating layer between the semiconductor substrate and the gate electrode, which contacts a side surface of the semiconductor pillar, and surrounds the semiconductor pillar;
    doping an impurity of a low concentration into the second insulating layer, thereby forming a first extension region in part of the semiconductor pillar, which is located on a side surface of the second insulating layer;
    forming a third insulating layer between the gate electrode and the first insulating layer, which contacts a side surface of the semiconductor pillar, and surrounds the semiconductor pillar; and
    doping the impurity of the low concentration into the third insulating layer, thereby forming a second extension region in part of the semiconductor pillar, which is located on a side surface of the third insulating layer.

5. The method according to claim 1, wherein the gate electrode includes a first gate electrode portion and a second gate electrode portion, the first gate electrode portion contacting the gate insulating film, the second gate electrode portion being formed to cover a side surface of the first gate electrode portion.

6. The method according to claim 1, wherein the impurity is doped in a direction perpendicular to the semiconductor substrate.

7. The method according to claim 1, wherein:
    the semiconductor substrate includes a support substrate, a fourth insulating layer provided on the support substrate, and a semiconductor layer provided on the fourth insulating layer; and
    the semiconductor pillar is formed by etching the semiconductor layer.

8. A method of manufacturing a semiconductor device, comprising:
    forming a mask layer on a semiconductor substrate;
    etching the semiconductor substrate using the mask layer as a mask, thereby forming a semiconductor pillar; and
    forming each of a plurality of MOS transistors in the semiconductor pillar and on a side surface of the semiconductor pillar, such that the MOS transistors are stacked together,
    wherein the forming said each of the plurality of MOS transistors including:
    forming a first insulating layer which contacts a side surface of the semiconductor pillar, and surrounds the semiconductor pillar;
    doping an impurity into the first insulating layer, thereby forming a first source/drain region in part of the semiconductor pillar, which is located on a side surface of the first insulating layer;
    forming a gate insulating film on the first insulating layer, which contacts a side surface of the semiconductor pillar, and surrounds the semiconductor pillar;
    forming a gate electrode on a side surface of the gate insulating film;
    forming a second insulating layer on the gate electrode, which contacts a side surface of the semiconductor pillar, and surrounds the semiconductor pillar; and
    doping the impurity into the second insulating layer, thereby forming a second source/drain region in part of the semiconductor pillar, which is located on a side surface of the second insulating layer.

9. The method according to claim 8, wherein the MOS transistors are formed in respective parts of the semiconductor pillar, which have substantially the same diameters.

10. The method according to claim 8, wherein any adjacent two of the MOS transistors share a source/drain region.

11. The method according to claim 8, which further comprises:
    forming a third insulating layer between the first insulating layer and the gate electrode, which contacts a side surface of the semiconductor pillar, and surrounds the semiconductor pillar;

doping an impurity of a low concentration into the third insulating layer, thereby forming a first extension region in part of the semiconductor pillar, which is located on a side surface of the third insulating layer;

forming a fourth insulating layer between the gate electrode and the second insulating layer, which contacts a side surface of the semiconductor pillar, and surrounds the semiconductor pillar; and doping the impurity of the low concentration into the fourth insulating layer, thereby forming a second extension region in part of the semiconductor pillar, which is located on a side surface of the fourth insulating layer.

12. The method according to claim 8, which, after the forming the plurality of MOS transistors, further comprises:

forming an opening which exposes the gate electrode in said each MOS transistor; and embedding a conductor in the opening, thereby forming a contact plug which is electrically connected to the gate electrode.

13. The method according to claim 12, which further comprises, after the forming the opening, forming an insulating film on a side surface of the opening.

14. A method of manufacturing a semiconductor device, comprising:

forming a mask layer on a semiconductor substrate;

etching the semiconductor substrate using the mask layer as a mask, thereby forming a semiconductor pillar; and forming each of a plurality of memory cells in the semiconductor pillar and on a side surface of the semiconductor pillar, such that the memory cells are stacked together;

wherein the forming said each of the plurality of memory cells includes:

forming a first insulating layer which contacts a side surface of the semiconductor pillar, and surrounds the semiconductor pillar;

doping an impurity into the first insulating layer, thereby forming a first source/drain region in part of the semiconductor pillar, which is located on a side surface of the first insulating layer;

forming a gate insulating film on the first insulating layer, which contacts a side surface of the semiconductor pillar, and surrounds the semiconductor pillar;

forming a charge-storage layer on a side surface of the gate insulating film;

forming a gate-to-gate insulating film on a side surface of the charge-storage layer;

forming a control gate electrode on a side surface of the gate-to-gate insulating film;

forming a second insulating layer on the charge-storage layer, the gate-to-gate insulating film and the control gate electrode, which contacts a side surface of the semiconductor pillar, and surrounds the semiconductor pillar; and doping the impurity into the second insulating layer, thereby forming a second source/drain region in part of the semiconductor pillar, which is located on a side surface of the second insulating layer.

15. The method according to claim 14, which further comprises:

forming a first selection transistor under a lowermost one of the plurality of memory cells, the first selection transistor being connected in series with the lowermost one of the memory cells; and forming a second selection transistor on an uppermost one of the plurality of memory cells, the second selection transistor being connected in series with the uppermost one of the memory cells.

16. A method of manufacturing a semiconductor device, comprising:

forming a mask layer on a semiconductor substrate;

etching the semiconductor substrate using the mask layer as a mask, thereby forming a semiconductor pillar; and forming a memory cell in the semiconductor pillar and on a side surface of the semiconductor pillar, the memory cell including a selection transistor and a memory cell transistor, wherein the forming the memory cell includes:

forming a first insulating layer which contacts a side surface of the semiconductor pillar, and surrounds the semiconductor pillar;

doping an impurity into the first insulating layer, thereby forming a first source/drain region in part of the semiconductor pillar, which is located on a side surface of the first insulating layer;

forming a first gate insulating film on the first insulating layer, which contacts a side surface of the semiconductor pillar, and surrounds the semiconductor pillar;

forming a gate electrode on a side surface of the first gate insulating film;

forming a second insulating layer on the gate electrode, which contacts a side surface of the semiconductor pillar, and surrounds the semiconductor pillar;

doping the impurity into the second insulating layer, thereby forming a second source/drain region in part of the semiconductor pillar, which is located on a side surface of the second insulating layer;

forming a second gate insulating film on the second insulating layer, which contacts a side surface of the semiconductor pillar, and surrounds the semiconductor pillar;

forming a charge-storage layer on a side surface of the second gate insulating film;

forming a gate-to-gate insulating film on a side surface of the charge-storage layer;

forming a control gate electrode on a side surface of the gate-to-gate insulating film;

forming a third insulating layer on the charge-storage layer, the gate-to-gate insulating film and the gate electrode, which contacts a side surface of the semiconductor pillar, and surrounds the semiconductor pillar; and doping the impurity into the third insulating layer, thereby forming a third source/drain region in part of the semiconductor pillar, which is located on a side surface of the third insulating layer.

17. A semiconductor device comprising:

a semiconductor substrate;

a semiconductor pillar provided on the semiconductor substrate; and a plurality of MOS transistors provided in the semiconductor pillar and on a side surface of the semiconductor pillar, such that the MOS transistors are stacked together, wherein:

each of the MOS transistors includes (i) a first insulating layer which contacts a side surface of the semiconductor pillar, and surrounds the semiconductor pillar, (ii) a first source/drain region provided in part of the semiconductor pillar, which is located on a side surface of the first insulating layer, (iii) a gate insulating film provided on the first insulating layer, which contacts a side surface of the semiconductor pillar, and surrounds the semiconductor pillar, (iv) a gate electrode provided on a side surface of the gate insulating film; (v) a second insulating layer provided on the gate electrode, which contacts a side surface of the semiconductor pillar, and surrounds the semiconductor pillar, and (vi) a second source/drain region provided in part of the semiconductor pillar, which is located on a side surface of the second insulating layer;

an impurity concentration of the first insulating layer is substantially equal to that of the first source/drain region; and an impurity concentration of the second insulating layer is substantially equal to that of the second source/drain region.

18. The semiconductor device according to claim 17, wherein any adjacent two of the MOS transistors share a source/drain region.

19. A semiconductor device comprising:
a semiconductor substrate;
a semiconductor pillar provided on the semiconductor substrate; and
a plurality of MOS transistors in the semiconductor pillar and on a side surface of the semiconductor pillar, such that the MOS transistors are stacked together,
wherein:
each of the MOS transistors includes (i) a first insulating layer which contacts a side surface of the semiconductor pillar, and surrounds the semiconductor pillar, (ii) a first source/drain region provided in part of the semiconductor pillar, which is located on a side surface of the first insulating layer, (iii) a gate insulating film provided on the first insulating layer, which contacts a side surface of the semiconductor pillar, and surrounds the semiconductor pillar, (iv) a charge-storage layer provided on a side surface of the gate insulating film; (v) a gate-to-gate insulating film provided on a side surface of the charge-storage layer, (vi) a control gate electrode provided on a side surface of the gate-to-gate insulating film, (vii) a second insulating layer provided on the charge-storage layer, the gate-to-gate insulating film and the control gate electrode, which contacts a side surface of the semiconductor pillar, and surrounds the semiconductor pillar, and (viii) a second source/drain region provided in part of the semiconductor pillar, which is located on a side surface of the second insulating layer.

20. The semiconductor device according to claim 19, where an impurity concentration of the first insulating layer is substantially equal to that of the first source/drain region, and an impurity concentration of the second insulating layer is substantially equal to that of the second source/drain region.

* * * * *